(12) United States Patent  
Lin et al.

(10) Patent No.: US 9,318,411 B2  
(45) Date of Patent: Apr. 19, 2016

(54) SEMICONDUCTOR PACKAGE WITH PACKAGE-ON-PACKAGE STACKING CAPABILITY AND METHOD OF MANUFACTURING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRODGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 14/514,360

(22) Filed: Oct. 14, 2014

(65) Prior Publication Data

US 2015/0130046 A1    May 14, 2015

Related U.S. Application Data

(60) Provisional application No. 61/903,469, filed on Nov. 13, 2013, provisional application No. 61/911,036, filed on Dec. 3, 2013.

(51) Int. Cl.  
*H01L 23/34* (2006.01)  
*H01L 23/36* (2006.01)  
(Continued)

(52) U.S. Cl.  
CPC ............ *H01L 23/36* (2013.01); *H01L 23/3675* (2013.01); *H01L 23/5384* (2013.01);  
(Continued)

(58) Field of Classification Search  
CPC ....... H01L 23/36; H01L 24/97; H01L 25/105; H01L 23/5389; H01L 23/5384; H01L 23/3675; H01L 23/49816; H01L 23/552; H01L 24/13; H01L 24/16; H01L 24/32; H01L 24/33; H01L 24/73; H01L 24/81; H01L 24/83; H01L 24/92; H01L 25/0655; H01L 25/50; H01L 2224/0401; H01L 2224/131; H01L 2224/13144; H01L 2224/16225; H01L 2224/16235; H01L 2224/32225; H01L 2224/32245; H01L 2224/33181; H01L 2224/73204; H01L 2224/73253; H01L 2224/81203; H01L 2224/81207; H01L 2224/81815; H01L 2224/83192; H01L 2224/92125; H01L 2224/92225; H01L 2224/97; H01L 2225/1023; H01L 2225/1041; H01L 2225/1058; H01L 2225/1094; H01L 2924/12042; H01L 2924/15192; H01L 2924/1531; H01L 2924/157; H01L 2924/15787; H01L 2924/15788; H01L 2924/15793; H01L 2924/16153; H01L 2924/16172; H01L 2924/16235; H01L 2924/16251; H01L 2924/16724; H01L 2924/16747; H01L 2924/1676; H01L 2924/181  
See application file for complete search history.

(56) References Cited

U.S. PATENT DOCUMENTS 5,432,677 A    7/1995  Mowatt et al.  
6,544,812 B1 *  4/2003  Camenforte ............ H01L 23/36  
                                                         257/E23.069

(Continued)

*Primary Examiner* — Stephen W Smoot  
*Assistant Examiner* — Vicki B Booker  
(74) *Attorney, Agent, or Firm* — Pai Patent & Trademark Law Firm; Chao-Chang David Pai

(57) ABSTRACT

The present invention relates to a method of making a semiconductor package with package-on-package stacking capability. In accordance with a preferred embodiment, the method is characterized by the step of attaching a chip-on-interposer subassembly on a metallic carrier with the chip inserted into a cavity of the metallic carrier, and the step of selectively removing portions of the metallic carrier to define a heat spreader for the chip. The heat spreader can provide thermal dissipation, electromagnetic shielding and moisture barrier, whereas the interposer provides a CTE-matched interface and fan-out routing for the chip.

9 Claims, 28 Drawing Sheets

(51) Int. Cl.
  *H01L 23/00* (2006.01)
  *H01L 25/10* (2006.01)
  *H01L 23/367* (2006.01)
  *H01L 23/538* (2006.01)
  *H01L 23/552* (2006.01)
  *H01L 25/065* (2006.01)
  *H01L 25/00* (2006.01)
  *H01L 23/498* (2006.01)

(52) U.S. Cl.
  CPC ............ *H01L23/5389* (2013.01); *H01L 24/97* (2013.01); *H01L 25/105* (2013.01); *H01L 23/49816* (2013.01); *H01L 23/552* (2013.01); *H01L 24/13* (2013.01); *H01L 24/16* (2013.01); *H01L 24/32* (2013.01); *H01L 24/33* (2013.01); *H01L 24/73* (2013.01); *H01L 24/81* (2013.01); *H01L 24/83* (2013.01); *H01L 24/92* (2013.01); *H01L 25/0655* (2013.01); *H01L 25/50* (2013.01); *H01L 2224/0401* (2013.01); *H01L 2224/131* (2013.01); *H01L 2224/13144* (2013.01); *H01L 2224/13147* (2013.01); *H01L 2224/16225* (2013.01); *H01L 2224/16235* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2224/81203* (2013.01); *H01L 2224/81207* (2013.01); *H01L 2224/81815* (2013.01); *H01L 2224/83192* (2013.01); *H01L 2224/92125* (2013.01); *H01L 2224/92225* (2013.01); *H01L 2224/97* (2013.01); *H01L 2225/1023* (2013.01); *H01L 2225/1041* (2013.01); *H01L 2225/1058* (2013.01); *H01L 2225/1094* (2013.01); *H01L 2924/12042* (2013.01); *H01L 2924/157* (2013.01); *H01L 2924/1531* (2013.01); *H01L 2924/15192* (2013.01); *H01L 2924/15787* (2013.01); *H01L 2924/15788* (2013.01); *H01L 2924/15793* (2013.01); *H01L 2924/1676* (2013.01); *H01L 2924/16153* (2013.01); *H01L 2924/16172* (2013.01); *H01L 2924/16235* (2013.01); *H01L 2924/16251* (2013.01); *H01L 2924/16724* (2013.01); *H01L 2924/16747* (2013.01); *H01L 2924/181* (2013.01)

(56) References Cited

U.S. PATENT DOCUMENTS

| | | | |
|---|---|---|---|
| 6,590,291 B2 | 7/2003 | Akagawa | |
| 6,909,054 B2 | 6/2005 | Sakamoto et al. | |
| 8,410,614 B2 | 4/2013 | Kunimoto | |
| 8,438,727 B2 | 5/2013 | Sakamoto et al. | |
| 8,501,544 B2 | 8/2013 | Pagaila | |
| 2005/0280141 A1* | 12/2005 | Zhang | H01L 23/3128 257/707 |
| 2007/0231953 A1* | 10/2007 | Tomita | H01L 21/4867 438/106 |
| 2013/0249106 A1 | 9/2013 | Lin et al. | |
| 2014/0175633 A1 | 6/2014 | Lin et al. | |
| 2015/0115433 A1 | 4/2015 | Lin et al. | |
| 2015/0118794 A1 | 4/2015 | Lin et al. | |
| 2015/0137338 A1 | 5/2015 | Lin et al. | |
| 2015/0155256 A1 | 6/2015 | Lin et al. | |

* cited by examiner

US 9,318,411 B2

SEMICONDUCTOR PACKAGE WITH PACKAGE-ON-PACKAGE STACKING CAPABILITY AND METHOD OF MANUFACTURING THE SAME

CROSS REFERENCE TO RELATED APPLICATIONS

This application claims the benefit of filing date of U.S. Provisional Application Ser. No. 61/903,469 filed Nov. 13, 2013 and the benefit of filing date of U.S. Provisional Application Ser. No. 61/911,036 filed Nov. 20, 2013. The entirety of each said Provisional Application is incorporated herein by reference.

FIELD OF THE INVENTION

The present invention relates to a semiconductor package with package-on-package stacking capability, more particularly, to a stackable semiconductor package having a built-in heat spreader for embedded chip and a method of making the same.

DESCRIPTION OF RELATED ART

The convergence of mobility, communication, and computing has created significant thermal, electrical and reliability challenges to the semiconductor packaging industry. Despite numerous package-on-package assemblies reported in the literature, many performance-related deficiencies remain. For example, the package-on-package assemblies disclosed in U.S. Patent Publication No. 2013/0249106 and U.S. Pat. Nos. 8,438,727, 8,410,614 may render performance degradation problems as the heat generated by embedded chip cannot be dissipated properly through the thermally insulating material such as laminate or mold compound.

Stackable assemblies disclosed in U.S. Pat. Nos. 5,432, 677, 6,590,291, 6,909,054 and 8,410,614 utilize laser or photo-imaging process to form micro-vias directly on the I/O pads of embedded chip so as to electrically connect the chip and build-up circuitry. However, with the advances of chip fabrication technologies, the number of I/O pads steadily increasing and the I/O pad spacing (pitch) decreases accordingly. As a result, the use of the micro-via approach presents a crowding problem which can cause shorting between the neighboring micro-vias.

Another significant drawback arising from the fabrication of the above assemblies is that the embedded chip may dislocate during encapsulation or lamination. Incomplete metallization of micro-vias due to chip dislocation as described in U.S. Pat. No. 8,501,544 further degrades the quality of the electrical connection, thereby lowering the reliability and production yield of the fabricated assembly.

For the reasons stated above, and for other reasons stated below, an urgent need exists to develop a new apparatus and method to interconnect embedded chip without using micro-via at I/O pad to improve chip-level reliability, and avoid the use of thermally insulating material such as mold compound or laminate to encapsulate the chip so as to prevent overheating of the chip that creates enormous concerns in device reliability and electrical performance.

SUMMARY OF THE INVENTION

A primary objective of the present invention is to provide a semiconductor package for package-on-package stacking in which a chip is interconnected to a low CTE (coefficient of thermal expansion) interposer by a plurality of bumps so as to resolve CTE mismatch and positional recognition problems between the chip and build-up circuitry, thereby improving the production yield and reliability of the semiconductor package.

Another objective of the present invention is to provide a semiconductor package for package-on-package stacking in which a chip-on-interposer subassembly is attached to a metallic heat spreader with the chip enclosed in a cavity of the heat spreader so as to effectively dissipate the heat generated by the chip, thereby improving signal integrity and electrical performance of the semiconductor package.

In accordance with the foregoing and other objectives, the present invention proposes a semiconductor package with package-on-package stacking capability that includes a chip, an interposer, an adhesive, a metallic heat spreader, dual buildup circuitries and plated through holes. The chip is electrically coupled to the interposer by bumps and embedded in a cavity of the metallic heat spreader. The dual buildup circuitries are top and bottom buildup circuitries disposed at opposite sides of the package and electrically connected to each other through the plated through holes to provide the package with stacking capability. Another semiconductor package may be mounted on the top or the bottom buildup circuitry of the package to form a package-on-package assembly.

In one aspect, the present invention provides a method of making a semiconductor package with package-on-package stacking capability, including the steps of: providing a chip; providing an interposer that includes a first surface, a second surface opposite to the first surface, first contact pads on the first surface, second contact pads on the second surface, and through vias that electrically couple the first contact pads and the second contact pads; electrically coupling the chip to the second contact pads of the interposer by a plurality of bumps to form a chip-on-interposer subassembly; providing a metallic carrier having a first surface, an opposite second surface, and a cavity formed in the first surface; attaching the chip-on-interposer subassembly to the metallic carrier using an adhesive with the chip inserted into the cavity and the interposer laterally extending beyond the cavity; with the chip-on-interposer subassembly to the metallic carrier, forming a first buildup circuitry on the first surface of the interposer, wherein the first buildup circuitry is electrically coupled to the first contact pads of the interposer through first conductive vias of the first buildup circuitry; selectively removing portions of the metallic carrier to form a metallic heat spreader, which is a first remaining portion of the metallic carrier enclosing the chip within the cavity and has a first surface corresponding to the first surface of the metallic carrier and an opposite second surface; forming a core layer that laterally covers sidewalls of the metallic heat spreader; forming a second buildup circuitry on the second surface of the metallic heat spreader and the core layer, wherein the second buildup circuitry preferably includes second conductive vias for electrically and thermally coupling to the metallic heat spreader; and forming plated through holes that extend through the core layer to provide electrical and thermal connections between the first buildup circuitry and the second buildup circuitry.

In another aspect, the present invention provides another method of making a semiconductor package with package-on-package stacking capability, including the steps of: providing a chip; providing an interposer that includes a first surface, a second surface opposite to the first surface, first contact pads on the first surface, second contact pads on the second surface, and through vias that electrically couple the first contact pads and the second contact pads; electrically coupling the chip to the second contact pads of the interposer by a plurality of bumps to form a chip-on-interposer subassembly; providing a metallic carrier which serves as a metallic heat spreader having a first surface, an opposite second surface, and a cavity formed in the first surface; forming through openings that extend through the metallic carrier between the first surface and the second surface thereof; attaching the chip-on-interposer subassembly to the metallic carrier using an adhesive with the chip inserted into the cavity and the interposer laterally extending beyond the cavity; with the chip-on-interposer subassembly attached to the metallic carrier, forming a first buildup circuitry on the first surface of the interposer, wherein the first buildup circuitry is electrically coupled to the first contact pads of the interposer through first conductive vias of the first buildup circuitry; forming a second buildup circuitry on the second surface of the metallic carrier, wherein the second buildup circuitry preferably includes second conductive vias for electrically and thermally coupling to the metallic carrier; and forming plated through holes that extend through the through openings to provide electrical and thermal connections between the first buildup circuitry and the second buildup circuitry.

Unless specific descriptions or steps necessarily occurring in a certain order, the sequence of the above-mentioned steps is not limited to that set forth above and may be changed or reordered according to desired design.

In yet another aspect, the present invention provides a semiconductor package with package-on-package stacking capability fabricated by the above-mentioned method and includes a chip, an interposer, an adhesive, a metallic heat spreader, a first buildup circuitry, a second buildup circuitry and plated through holes, wherein (i) the chip is electrically coupled to the second contact pads of the interposer by a plurality of bumps and is positioned within the cavity of the metallic heat spreader; (ii) the interposer extends laterally beyond the cavity with the second surface of the interposer attached to a flat surface of the metallic heat spreader that is adjacent to and laterally extends from the cavity entrance; (iii) the adhesive is sandwiched between the chip and the metallic heat spreader and between the interposer and the metallic heat spreader; (iv) the first buildup circuitry is disposed on the first surface of the interposer and is electrically coupled to the first contact pads of the interposer through first conductive vias of the first buildup circuitry; (v) the second buildup circuitry is disposed on the second surface of the metallic heat spreader and is preferably electrically and thermally coupled to the metallic heat spreader through second conductive vias of the second buildup circuitry; and (vi) the plated through holes at the first end extend to the first buildup circuitry and at the second end extend to the second buildup circuitry and provide electrical and thermal connections between the first buildup circuitry and the second buildup circuitry.

The method of making a semiconductor package for package-on-package stacking applications according to the present invention has numerous advantages. For instance, forming the chip-on-interposer subassembly before attaching it to the metal carrier can ensure the chip is electrically connected so that any contact pad disconnection problem inherent to micro-via process can be avoided. Inserting the chip to the cavity through the chip-on-interposer subassembly is particularly advantageous as the shape or depth of the cavity or the amount of the adhesive that needs to bind the chip would not be a critical parameter that needs tightly controlled. Additionally, the two-step forming of the interconnect substrate for the embedded chip is beneficial as the interposer can provide primary fan-out routing and a CTE-matched interface whereas the buildup circuitries provide further fan-out routing and horizontal interconnections between the upper and the lower packages.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-32 are views showing a method of making a semiconductor package for package-on-package stacking, that includes an interposer, chips, a metallic heat spreader, a core layer, dual buildup circuitries and plated through holes in accordance with an embodiment of the present invention.

Figure 32:
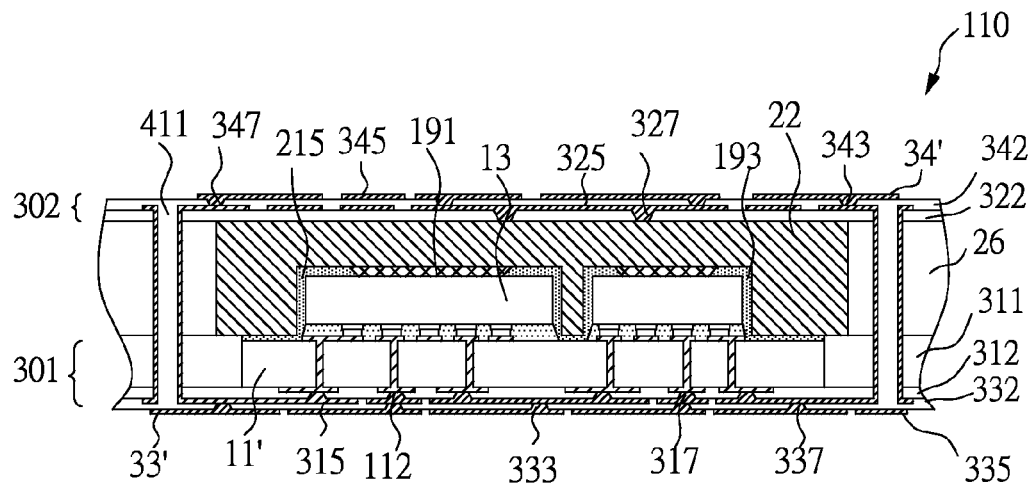
FIG. 32 is a cross-sectional view showing with a state in which the structure of FIG. 31 is provided with conductive traces to finish the fabrication of a semiconductor package in accordance with the first embodiment of the present invention.

As shown in FIG. 32, the semiconductor package 110 for package-on-package stacking application includes an interposer 11', chips 13, a metallic heat spreader 22, a core layer 26, a first buildup circuitry 301, a second buildup circuitry 302 and plated through holes 411. The interposer 11' and the chips 13 are attached to the metallic heat spreader 22 using a first adhesive 191 and a second adhesive 193, with the chips 13 embedded in cavities 215 of the metallic heat spreader 22. The core layer 26 laterally covers sidewalls of the metallic heat spreader 22. The first buildup circuitry 301 covers the interposer 11' and the core layer 26 from the lower side and is electrically coupled to first contact pads 112 of the interposer 11' through first conductive vias 317. The second buildup circuitry 302 covers the metallic heat spreader 22 and the core layer 26 from the upper side and is electrically and thermally coupled to the metallic heat spreader 22 through second conductive vias 327. The plated through holes 411 are spaced from the metallic heat spreader 22 and provide electrical and thermal connections between the first buildup circuitry 301 and the second buildup circuitry 302.

FIGS. 1, 3, 4, 6 and 8 are cross-sectional views showing a process of fabricating chip-on-interposer subassemblies in accordance with an embodiment of the present invention, and FIGS. 2, 5, 7 and 9 are top perspective views corresponding to FIGS. 1, 4, 6 and 8, respectively.

Figure 1:
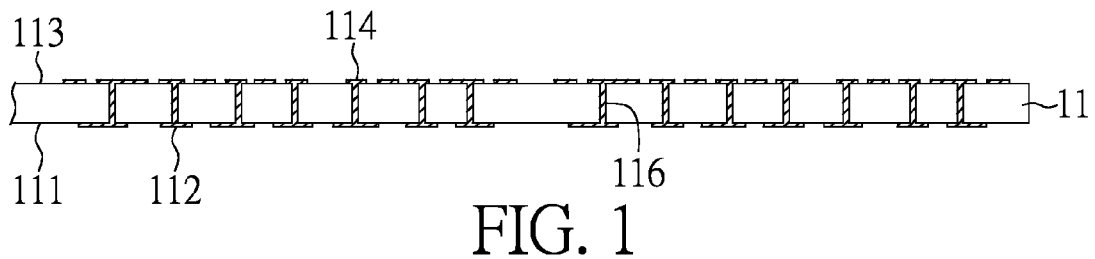
FIGS. 1 and 2 are cross-sectional and top perspective views, respectively, of an interposer panel in accordance with the first embodiment of the present invention.
Figure 2:
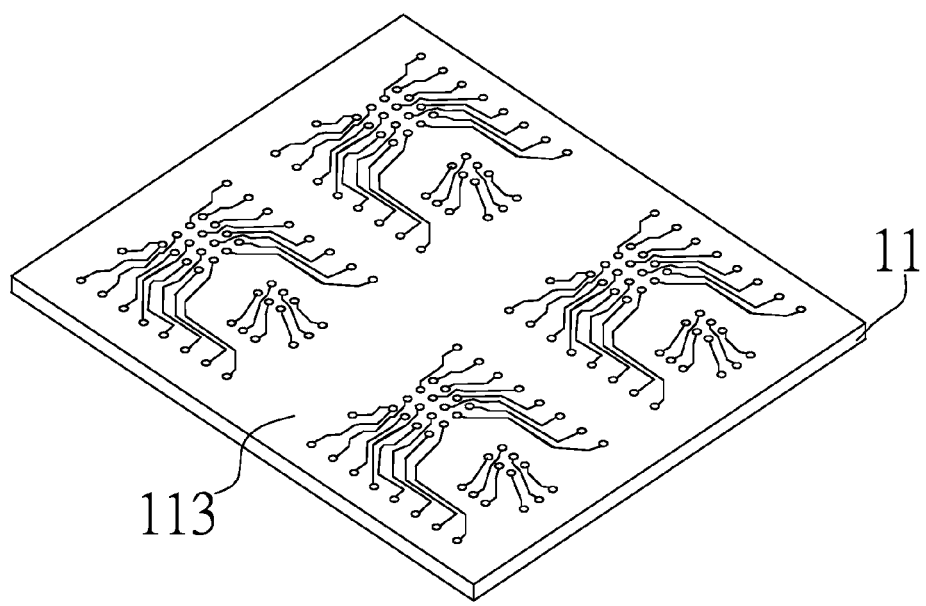

FIGS. 1 and 2 are cross-sectional and top perspective views, respectively, of an interposer panel 11, which includes a first surface 111, a second surface 113 opposite to the first surface 111, first contact pads 112 on the first surface 111, second contact pads 114 on the second surface 113, and through vias 116 that electrically couple the first contact pads 112 and the second contact pads 114. The interposer panel 11 can be a silicon, glass, ceramic or graphite interposer that contains a pattern of traces that fan out from a fine pitch at the second contact pads 114 to a coarse pitch at the first contact pads 112.

Figure 3:
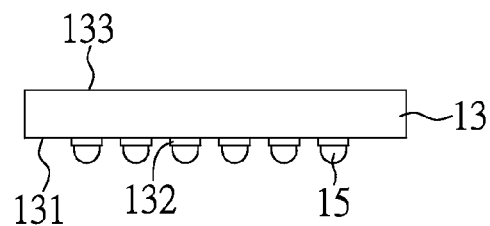
FIG. 3 is a cross-sectional view of a chip with bumps mounted thereon in accordance with the first embodiment of the present invention.

FIG. 3 is a cross-sectional view of a chip 13 with bumps 15 mounted thereon. The chip 13 includes an active surface 131, an inactive surface 133 opposite to the active surface 131, and I/O pads 132 on the active surface 131. The bumps 15 are mounted on the I/O pads 132 of the chip 13 and may be solder, gold or copper pillars.

Figure 4:
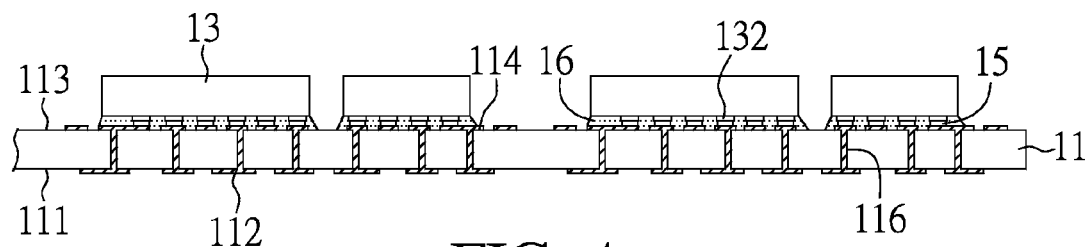
FIGS. 4 and 5 are cross-sectional and top perspective views, respectively, of a panel-scale assembly with the chips of FIG. 3 electrically coupled to the interposer panel of FIGS. 1 and 2 in accordance with the first embodiment of the present invention.
Figure 5:
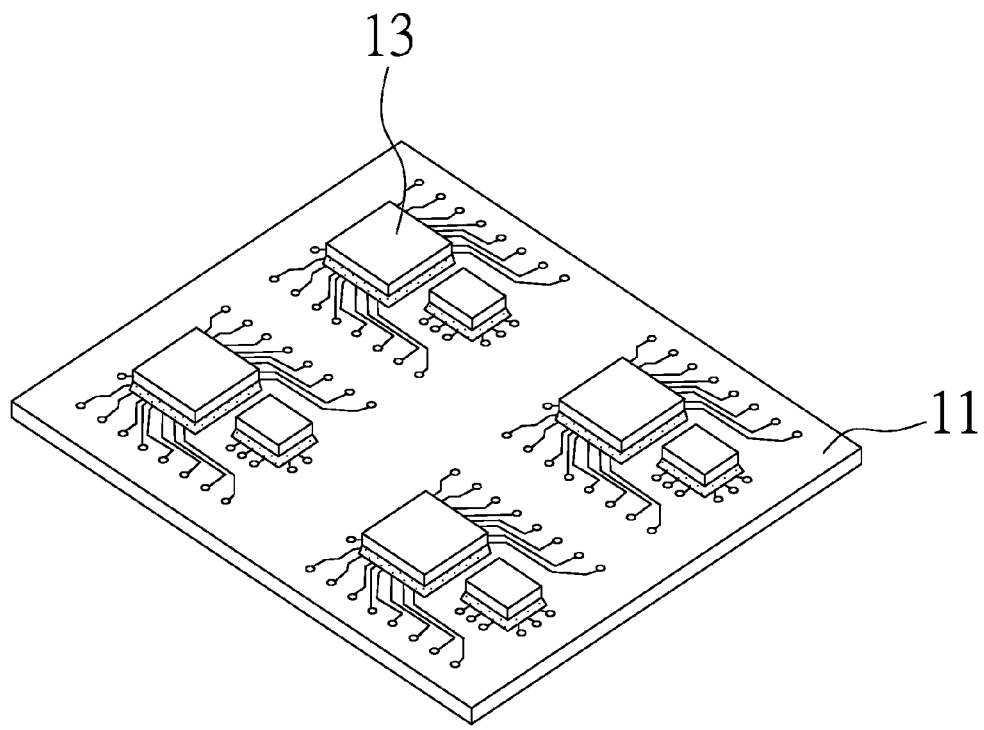

FIGS. 4 and 5 are cross-sectional and top perspective views, respectively, of the panel-scale assembly with the chips 13 electrically coupled to the interposer panel 11. The chips 13 can be electrically coupled to the second contact pads 114 of the interposer panel 11 using the bumps 15 by thermal compression, solder reflow or thermosonic bonding. As an alternative, the bumps 15 may be first deposited on the second contact pads 114 of the interposer panel 11, and then the chips 13 are electrically coupled to the interposer panel 11 by the bumps 15. Optionally, underfill 16 can be further provided to fill the gap between the interposer panel 11 and the chips 13.

Figure 6:
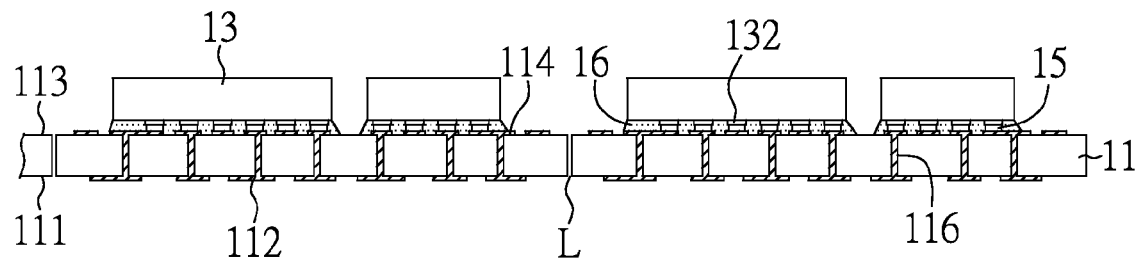
FIGS. 6 and 7 are cross-sectional and top perspective views, respectively, of a diced state of the panel-scale assembly of FIGS. 4 and 5 in accordance with the first embodiment of the present invention.
Figure 7:
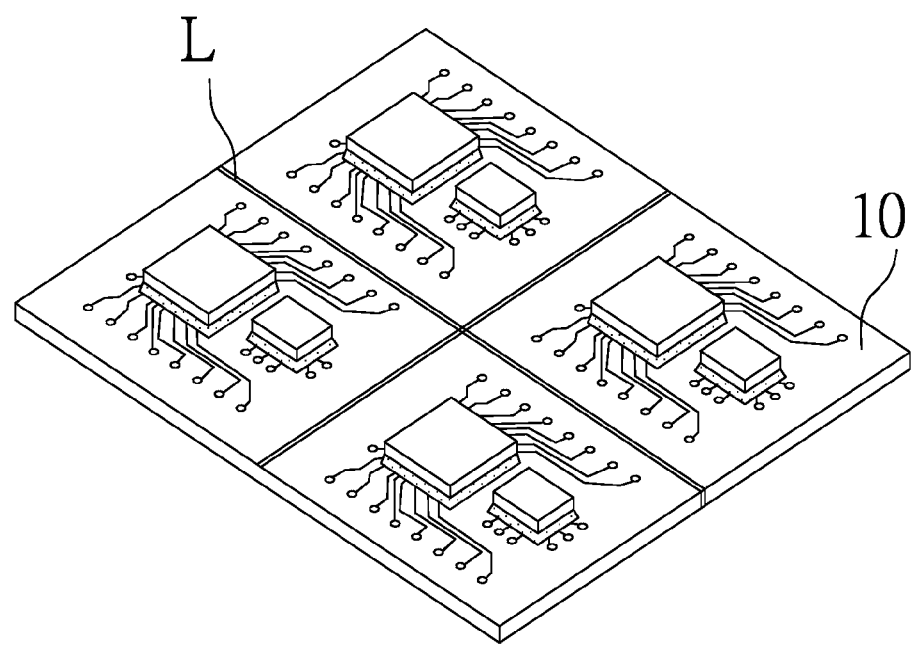

FIGS. 6 and 7 are cross-sectional and top perspective views, respectively, of the panel-scale assembly diced into individual pieces. The panel-scale assembly is singulated into individual chip-on-interposer subassembly 10 along dicing lines "L".

Figure 8:
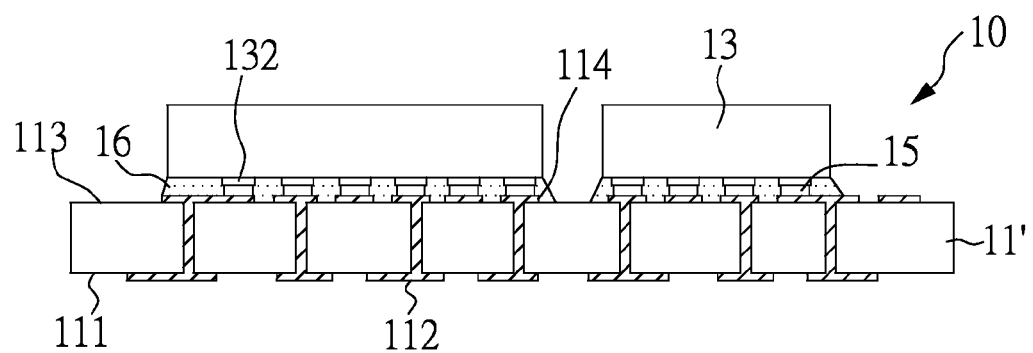
FIGS. 8 and 9 are cross-sectional and top perspective views, respectively, of a chip-on-interposer subassembly corresponding to a diced unit in FIGS. 6 and 7 in accordance with the first embodiment of the present invention.
Figure 9:
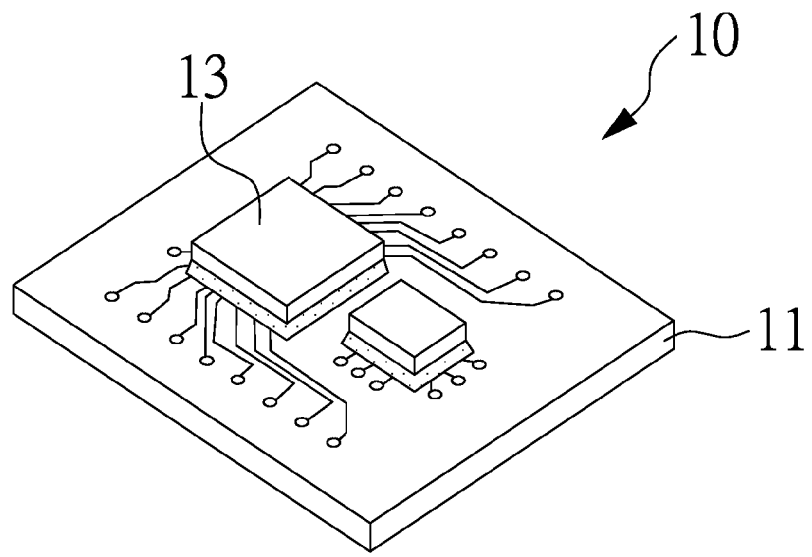

FIGS. 8 and 9 are cross-sectional and top perspective views, respectively, of the individual chip-on-interposer subassembly 10. In this illustration, the chip-on-interposer subassembly 10 includes two chips 13 electrically coupled to the diced interposer 11'. As the size and pad spacing of the first contact pads 112 of the interposer 11' are designed to be larger than those of the chip I/O pads 132, the interposer 11' can provide a primary fan-out routing for the chips 13 so as to ensure a higher manufacturing yield for the next level buildup circuitry interconnection. Furthermore, the interposer 11' also provides primary electrical connections between adjoining chips 13 prior to interconnecting to the next level interconnection structure.

Figure 10:
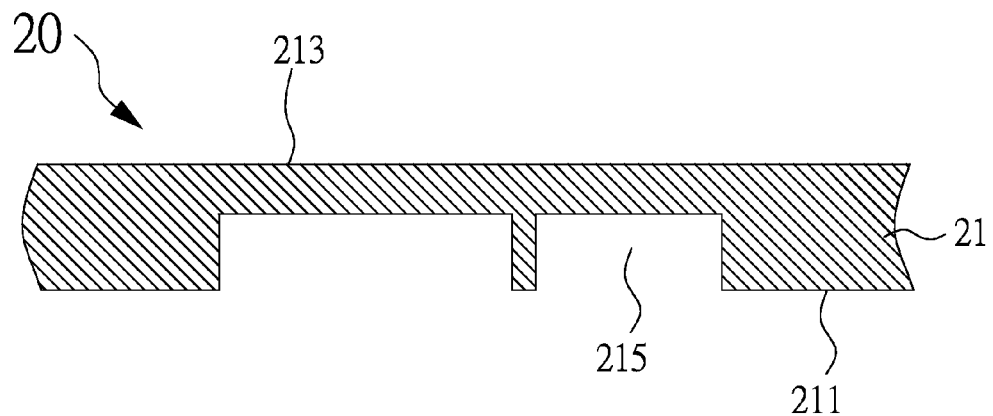
FIGS. 10 and 11 are cross-sectional and bottom perspective views, respectively, of a metallic carrier in accordance with the first embodiment of the present invention.
Figure 11:
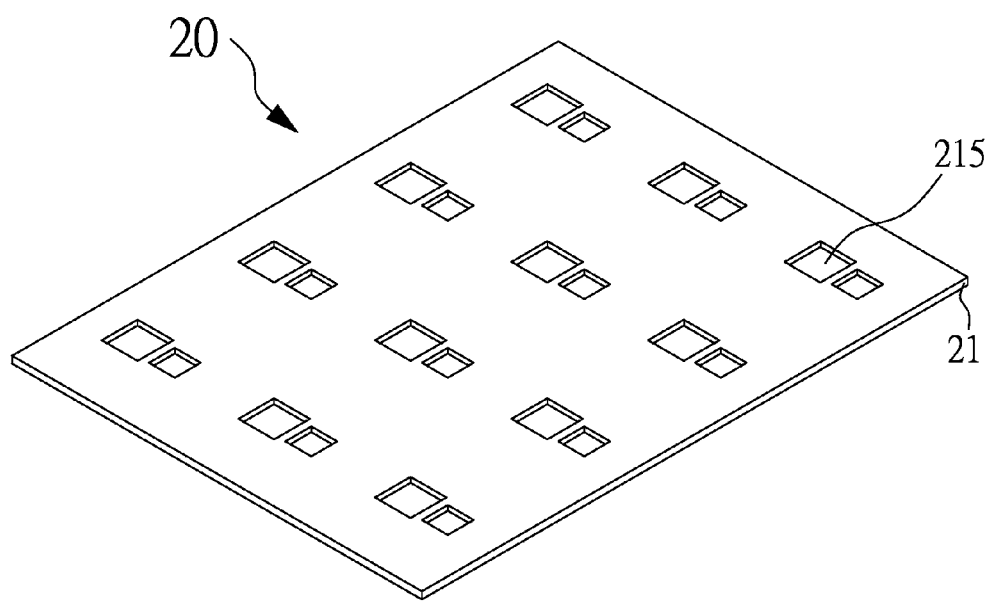

FIGS. 10 and 11 are cross-sectional and bottom perspective views, respectively, of a metallic carrier 20 with a first surface 211, an opposite second surface 213 and cavities 215. The metallic carrier 20 can be provided by forming the cavities 215 in a metal plate 21. The metal plate 21 can have a thickness of 0.1 mm to 10 mm, and is made of copper, aluminum, stainless steel or their alloys. In this embodiment, the metal plate 21 is a copper sheet with a thickness of 2 mm. The cavities 215 include an entrance at the first surface 211 and each of them can have a different size and cavity depth. The cavity depth can range from 0.05 mm to 1.0 mm. In this illustration, the cavity 215 is 0.16 mm (to house the 0.1 mm chip with 0.05 mm conductive bump).

Figure 12:
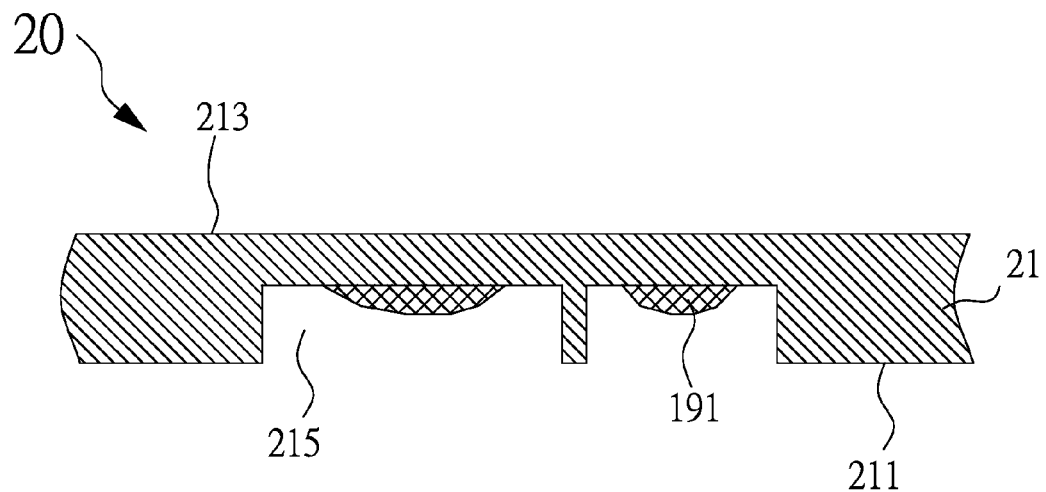
FIGS. 12 and 13 are cross-sectional and bottom perspective views, respectively, showing a state in which an adhesive is dispensed on the metallic carrier of FIGS. 10 and 11 in accordance with the first embodiment of the present invention.
Figure 13:
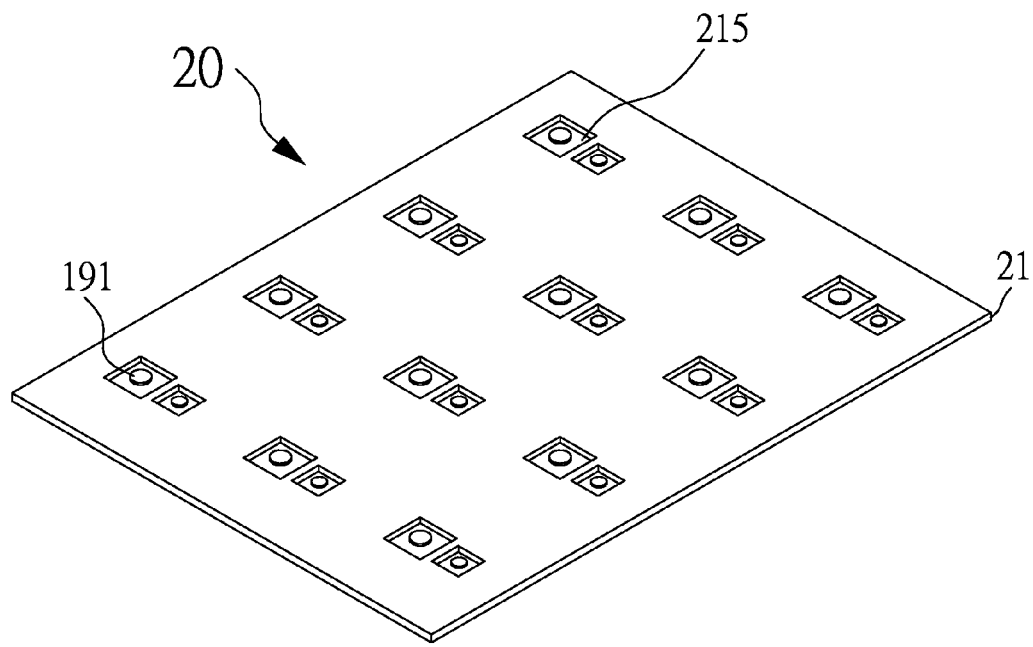

FIGS. 12 and 13 are cross-sectional and bottom perspective views, respectively, of the metallic carrier 20 with a first adhesive 191 dispensed in the cavities 215. The first adhesive 191 typically is a thermally conductive adhesive and dispensed on the bottom of the cavities 215.

Figure 14:
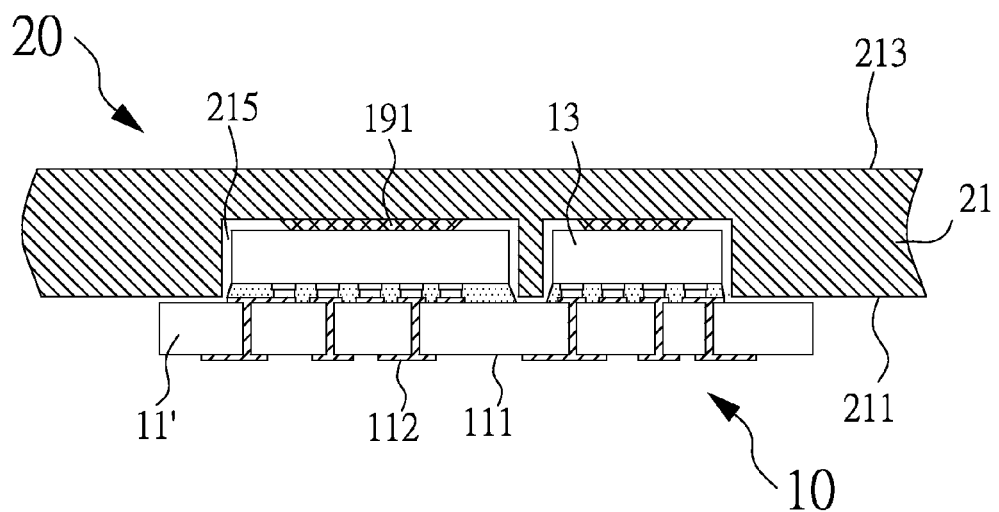
FIGS. 14 and 15 are cross-sectional and bottom perspective views, respectively, showing a state in which the chip-on-interposer subassemblies of FIGS. 8 and 9 are attached to the metallic carrier of FIGS. 12 and 13 in accordance with the first embodiment of the present invention.
Figure 15:
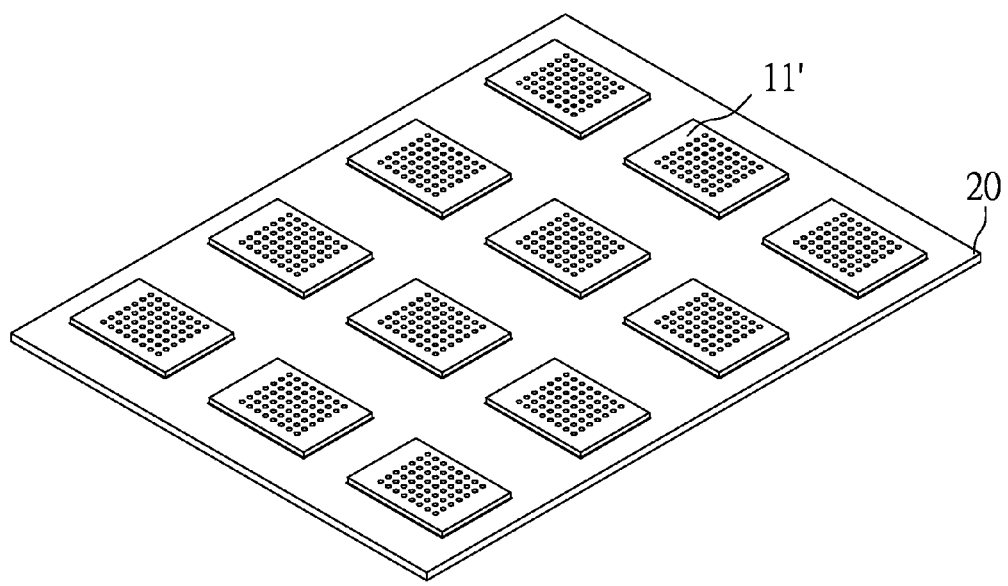

FIGS. 14 and 15 are cross-sectional and bottom perspective views, respectively, of the structure of the chip-on-interposer subassemblies 10 attached to the metallic carrier 20 using the first adhesive 191. The chips 13 are inserted into the cavities 215, and the interposers 11' are located beyond the cavities 215 and spaced from the peripheral edges of the metallic carrier 20.

Figure 16:
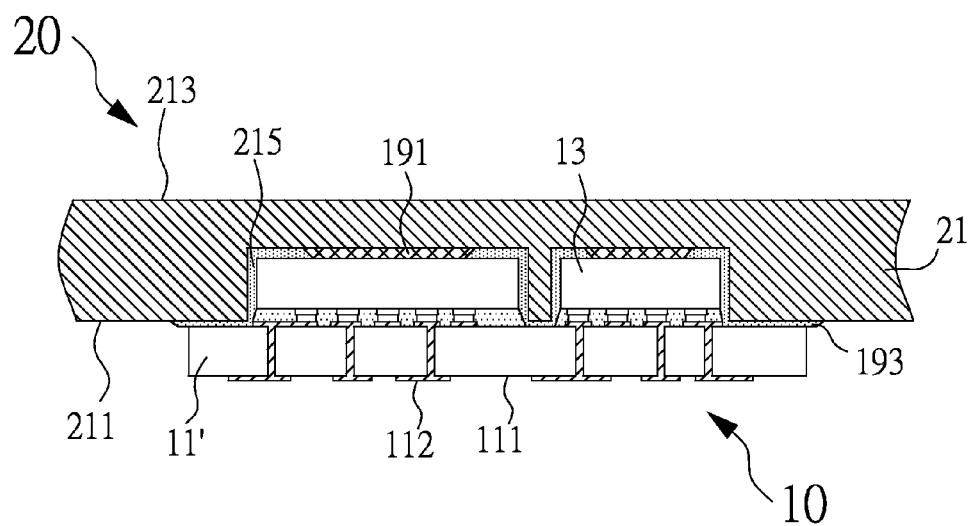
FIGS. 16 and 17 are cross-sectional and bottom perspective views, respectively, showing a state in which the structure of FIGS. 14 and 15 is provided with another adhesive in accordance with the first embodiment of the present invention.
Figure 17:
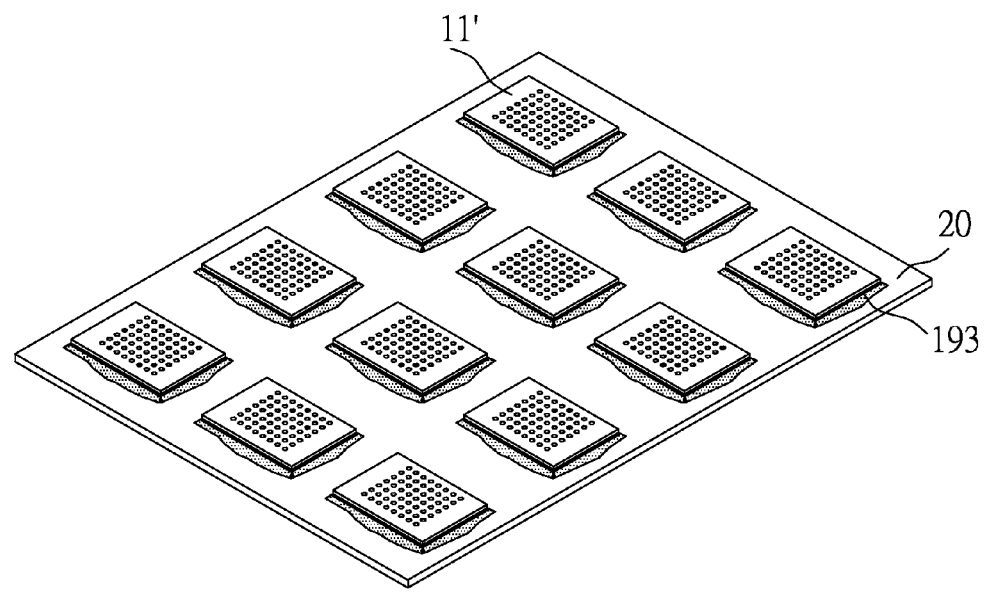

FIGS. 16 and 17 are cross-sectional and bottom perspective views, respectively, of the structure with the second adhesive 193 that fills the space between the interposers 11' and the metallic carrier 20 and further extends into the cavities 215. The second adhesive 193 typically is an electrically insulating underfill and dispensed into the space between the interposers 11' and the metallic carrier 20 and the remaining spaces within the cavities 215. As a result, the first adhesive 191 provides mechanical bonds and thermal connection between the chips 13 and the metallic carrier 20, and the second adhesive 193 provides mechanical bonds between the chips 13 and the metallic carrier 20 and between the interposers 11' and the metallic carrier 20.

Figure 18:
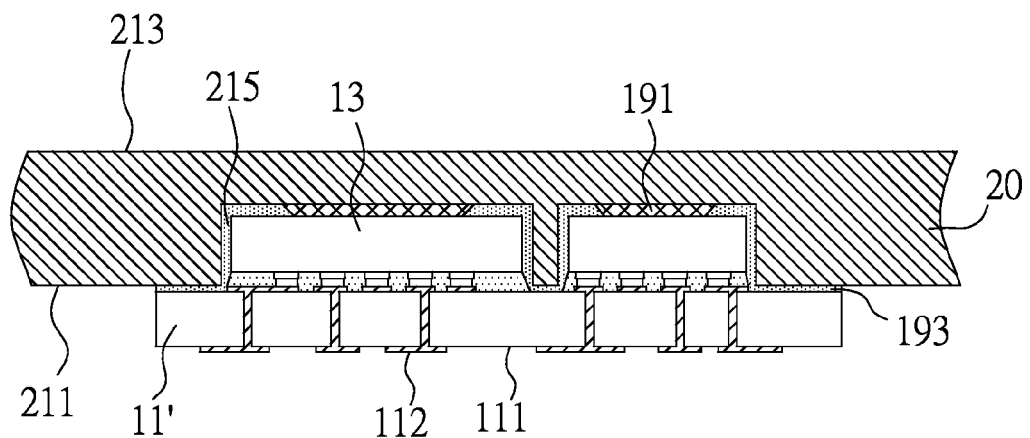
FIGS. 18 and 19 are cross-sectional and bottom perspective views, respectively, showing a state in which excess adhesive is removed from the structure of FIGS. 16 and 17 in accordance with the first embodiment of the present invention.
Figure 19:
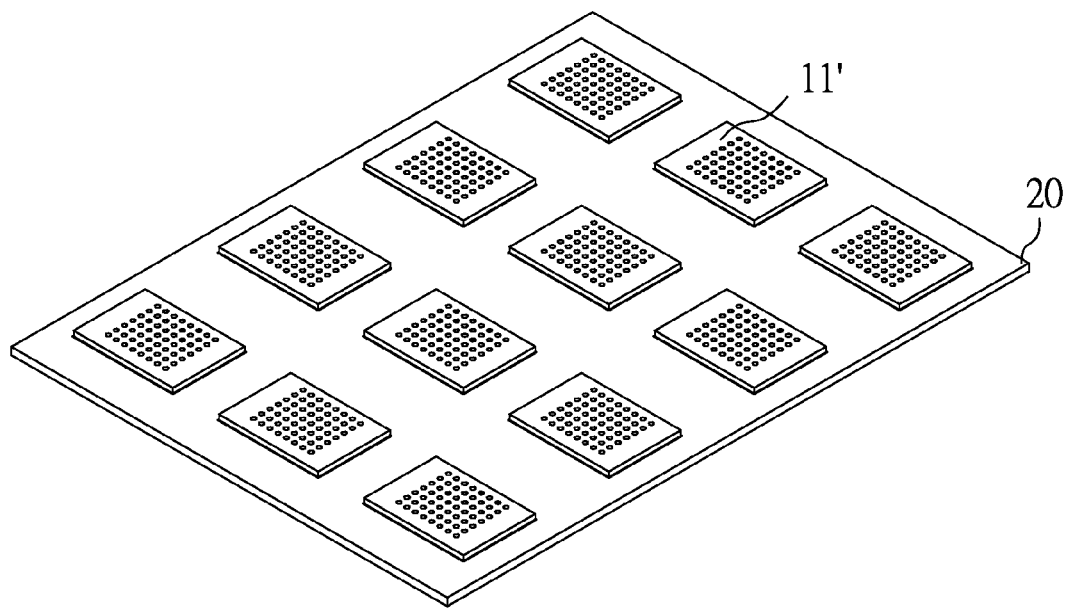

FIGS. 18 and 19 are cross-sectional and bottom perspective views, respectively, of the structure after removal of excess adhesive that flows out of the space between the interposers 11' and the metallic carrier 20. As an alternative, the step of removing excess adhesive may be omitted, and the excess adhesive becomes a portion of the subsequent buildup circuitry.

Figure 20:
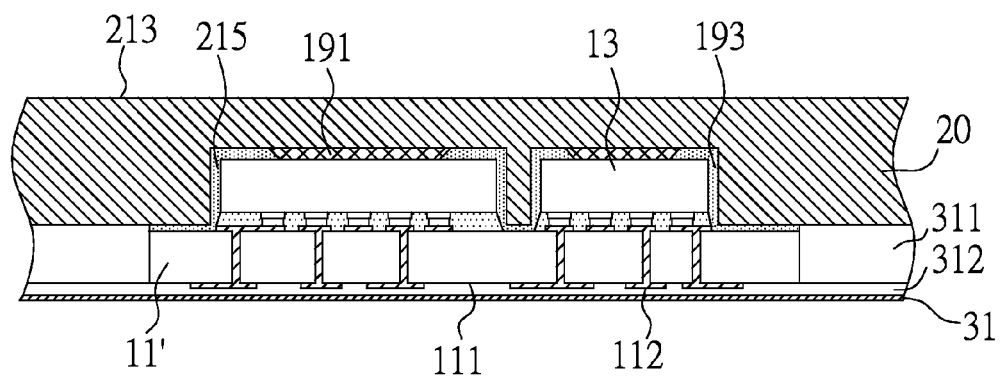
FIGS. 20 and 21 are cross-sectional and top perspective views, respectively, showing a state in which laminated layers are disposed on the structure of FIGS. 18 and 19 in accordance with the first embodiment of the present invention.
Figure 21:
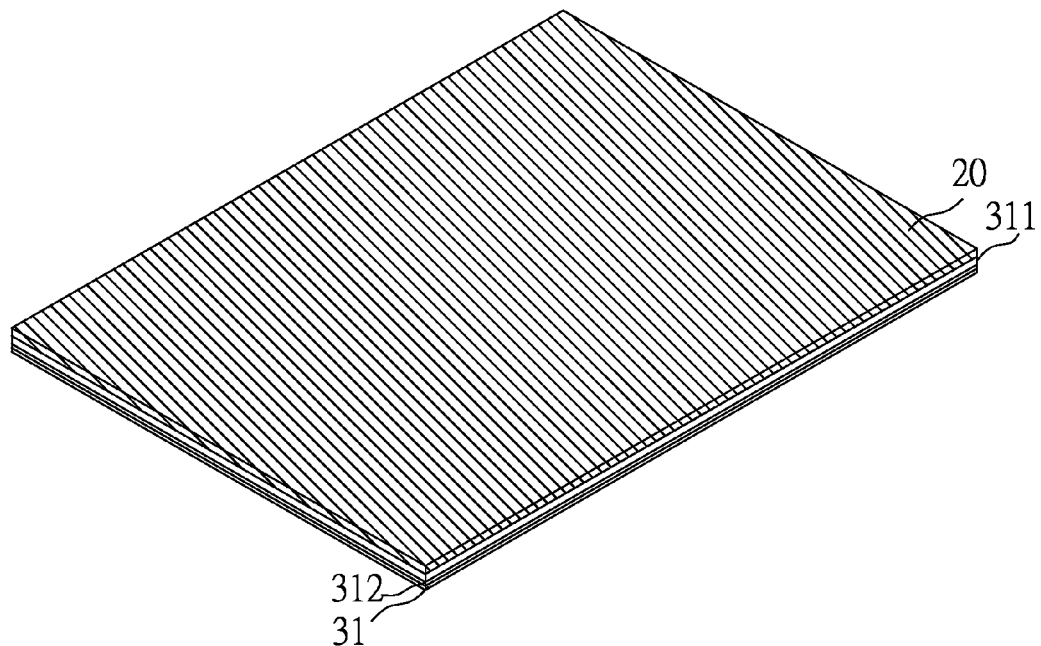

FIGS. 20 and 21 are cross-sectional and top perspective views, respectively, of the structure with a balancing layer 311, a first insulating layer 312 and a first metal sheet 31 laminated/coated on the interposers 11' and the metallic carrier 20 in the downward direction. The balancing layer 311 contacts and extends from the metallic carrier 20 in the downward direction and laterally covers and surrounds and conformally coats the sidewalls of the interposers 11' and extends laterally from the interposers 11' to the peripheral edges of the structure. The first insulating layer 312 contacts and covers and extends laterally on the first surface 111 of the interposers 11' and the balancing layer 311 in the downward direction. The first metal sheet 31 contacts and covers the first insulating layer 312 from below. In this embodiment, the balancing layer 311 has a thickness of 0.2 mm which is close to the thickness of the interposer 11', and the first insulating layer 312 typically has a thickness of 50 microns. The balancing layer 311 and the first insulating layer 312 can be made of epoxy resin, glass-epoxy, polyimide, and the like. The first metal sheet 31 in this embodiment is a copper layer with a thickness of 25 microns.

Figure 22:
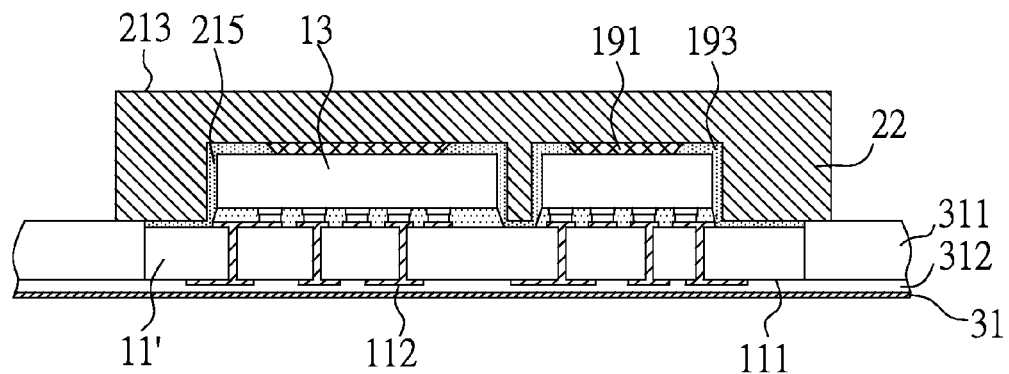
FIGS. 22 and 23 are cross-sectional and top perspective views, respectively, showing a state in which a metallic heat spreader is formed from the structure of FIGS. 20 and 21 in accordance with the first embodiment of the present invention.
Figure 23:
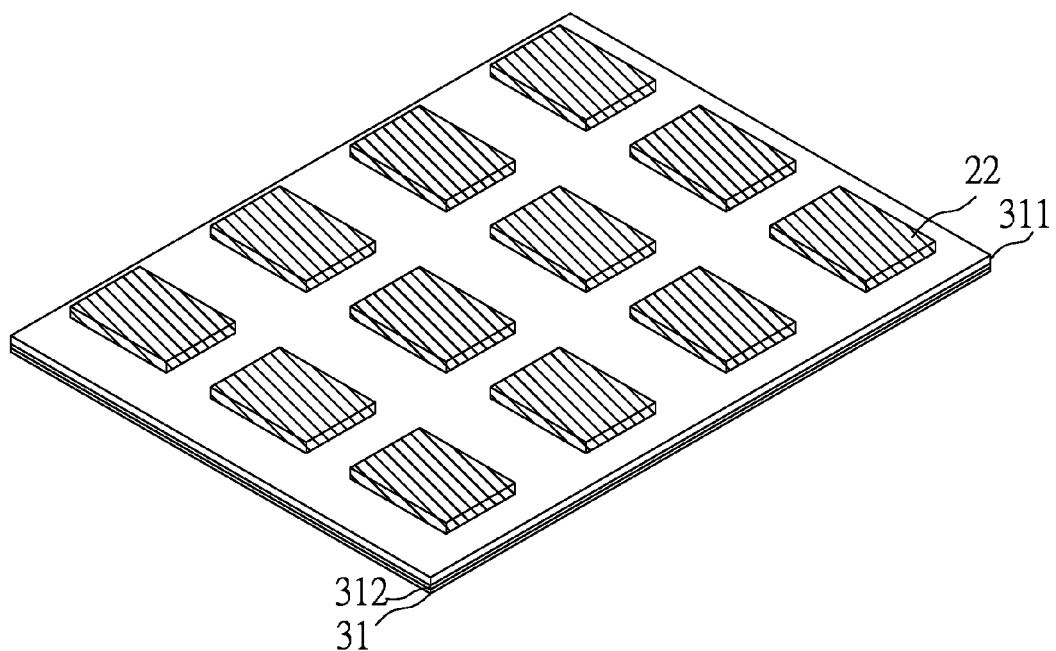

FIGS. 22 and 23 are cross-sectional and top perspective views, respectively, of the structure with the metallic heat spreader 22 formed by selectively removing portions of the metallic carrier 20 using photolithography and wet etching. The remaining portions of metallic carrier 20 correspond to the metallic heat spreader 22 that covers and encloses the chips 13 within the cavities 215 from above.

Figure 24:
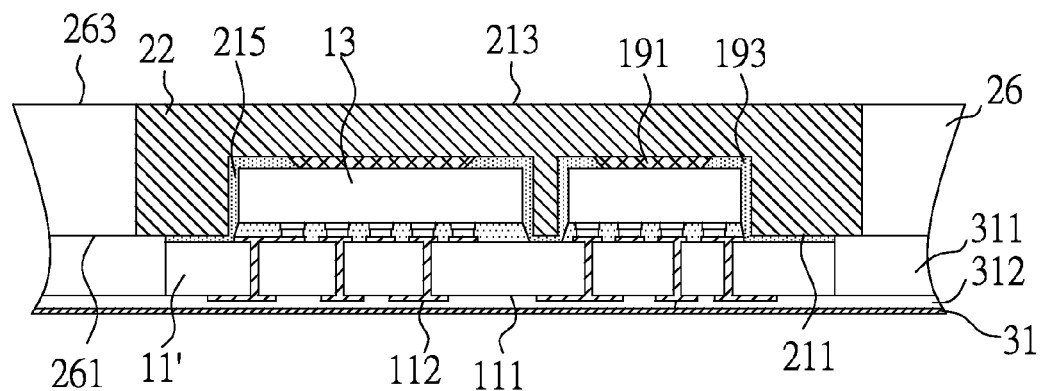
FIGS. 24 and 25 are cross-sectional and top perspective views, respectively, showing a state in which a core layer is disposed on the structure of FIGS. 22 and 23 in accordance with the first embodiment of the present invention.
Figure 25:
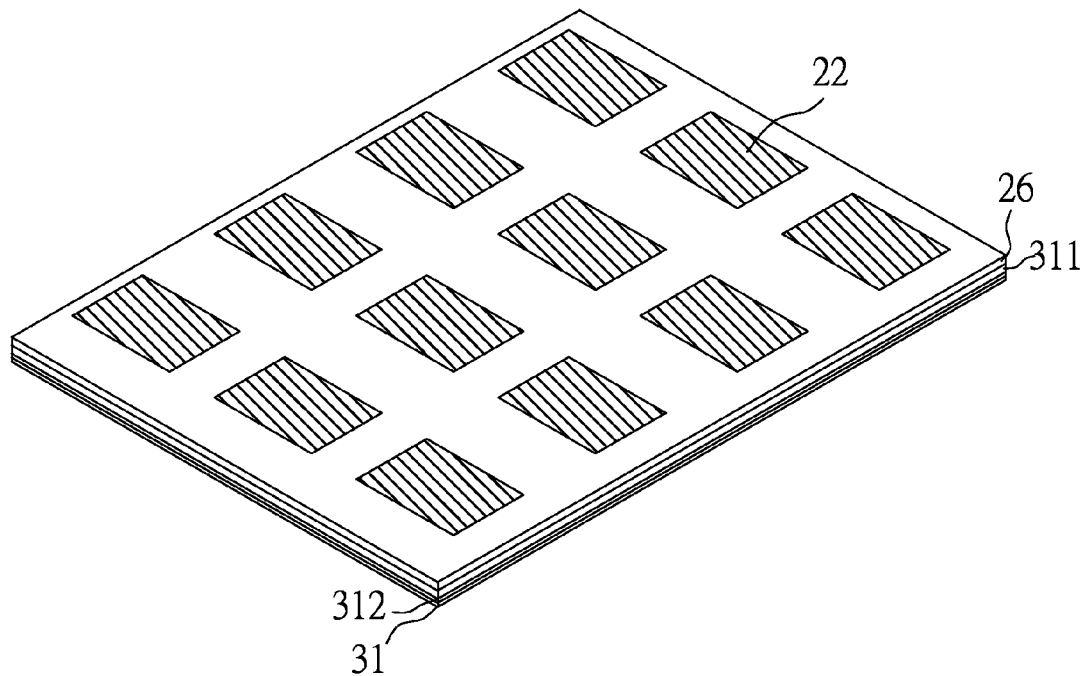

FIGS. 24 and 25 are cross-sectional and top perspective views, respectively, of the structure with the core layer 26 laminated/coated on the balancing layer 311 from above. The core layer 26 contacts and extends from the balancing layer 311 in the upward direction and laterally covers and surrounds and conformally coats the sidewalls of the metallic heat spreader 22 and extends laterally from the metallic heat spreader 22 to the peripheral edges of the structure. In this embodiment, the core layer 26 has a thickness of 0.2 mm which is close to the thickness of the metallic heat spreader 22, and can be made of epoxy resin, glass-epoxy, polyimide, and the like. As a result, the core layer 26 has a first surface 261 flush with the first surface 211 of the metallic heat spreader 22 and a second surface 263 flush with the second surface 213 of the metallic heat spreader 22.

Figure 26:
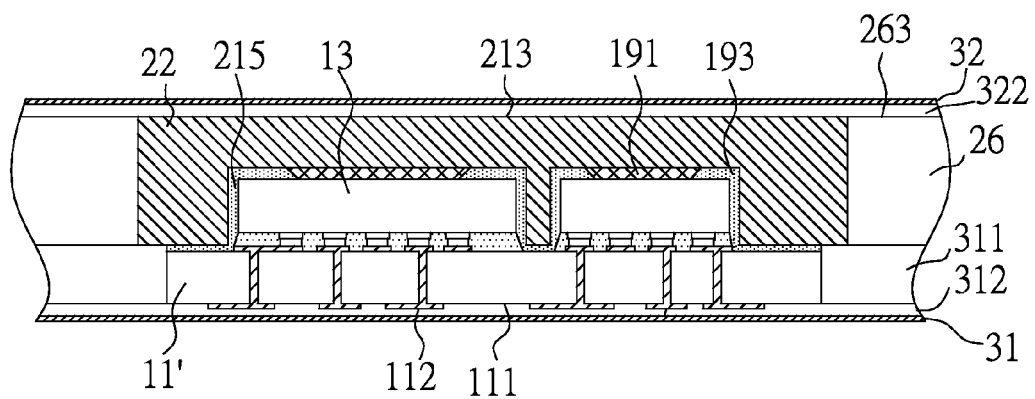
FIG. 26 is a cross-sectional view showing a state in which laminated layers are disposed on the structure of FIG. 24 in accordance with the first embodiment of the present invention.

FIG. 26 is a cross-sectional view of the structure with a second insulating layer 322 and a second metal sheet 32 laminated/coated on the metallic heat spreader 22 and the core layer 26 in the upward direction. The second insulating layer 322 contacts and covers and extends laterally on the second surface 213 of the metallic heat spreader 22 and the second surface 263 of the core layer 26 in the upward direction. The second metal sheet 32 contacts and covers the second insulating layer 322 from above. In this embodiment, the second insulating layer 322 typically has a thickness of 50 microns, and can be made of epoxy resin, glass-epoxy, polyimide, and the like. The second metal sheet 32 in this embodiment is a copper layer with a thickness of 25 microns.

Figure 27:
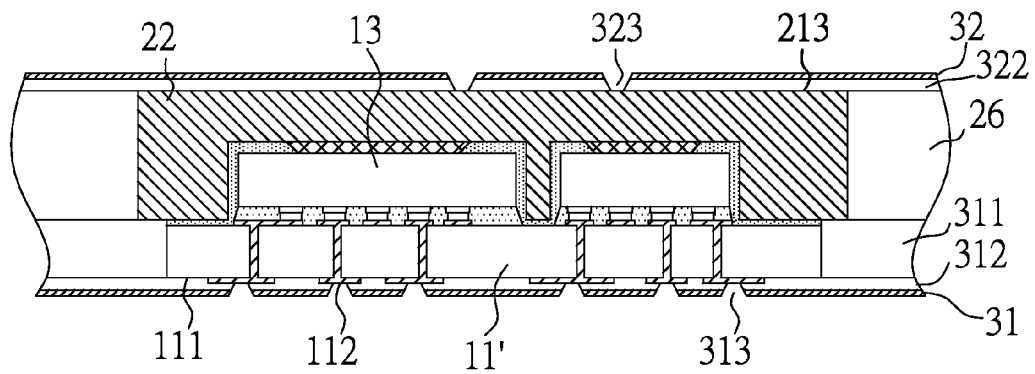
FIG. 27 is a cross-sectional view showing a state in which the structure of FIG. 26 is provided with via openings in accordance with the first embodiment of the present invention.

FIG. 27 is a cross-sectional view of the structure provided with first via openings 313 and second via openings 323. The first via openings 313 extend through the first metal sheet 31 and the first insulating layer 312 and are aligned with the first contact pads 112 of the interposer 11'. The second via openings 323 extend through the second metal sheet 32 and the second insulating layer 322 and are aligned with selected portions of the metallic heat spreader 22. The first and second via openings 313, 323 may be formed by numerous techniques including laser drilling, plasma etching and photolithography, and typically have a diameter of 50 microns. Laser drilling can be enhanced by a pulsed laser. Alternatively, a scanning laser beam with a metal mask can be used. For instance, copper can be etched first to create a metal window followed by laser. Preferably, the first via openings 313 and second via openings 323 are formed in the same manner and have the same size.

Figure 28:
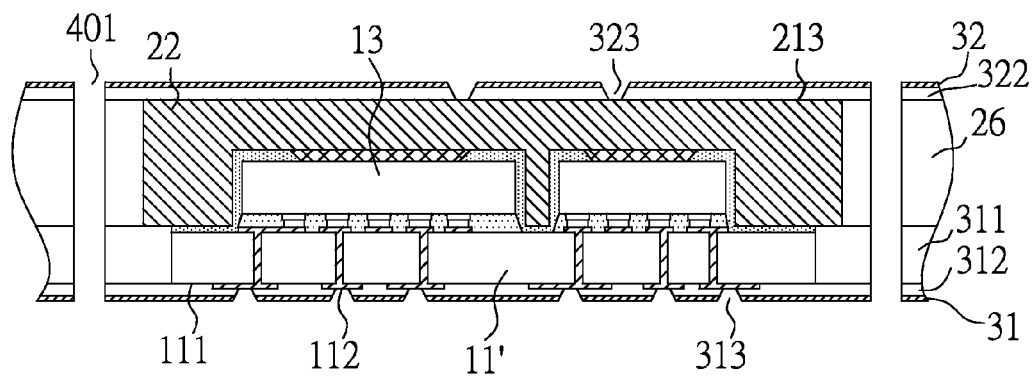
FIG. 28 is a cross-sectional view showing a state in which the structure of FIG. 27 is provided with through holes in accordance with the first embodiment of the present invention.

FIG. 28 is a cross-sectional view of the structure provided with through holes 401. The through holes 401 extend through the first metal sheet 31, the first insulating layer 312, the balancing layer 311, the core layer 26, the second insulating layer 322 and the second metal sheet 32 in the vertical direction. The through holes 401 are formed by mechanical drilling and can be formed by other techniques such as laser drilling and plasma etching with or without wet etching.

Figure 29:
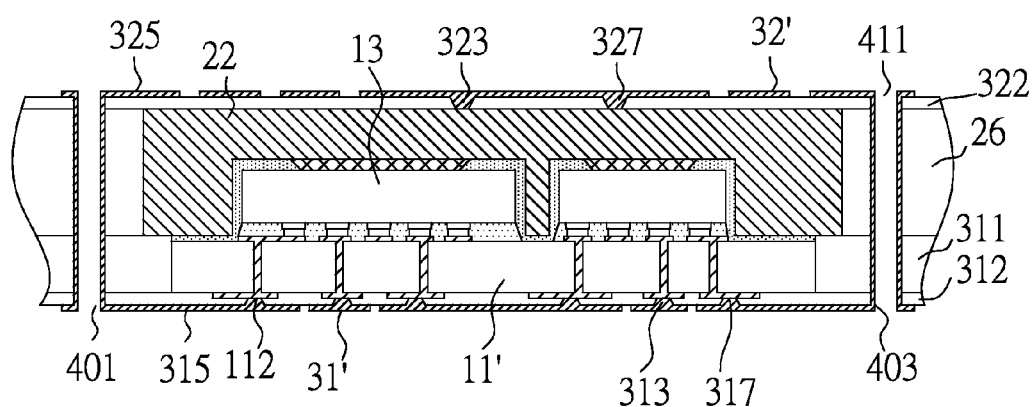
FIG. 29 is a cross-sectional view showing a state in which the structure of FIG. 28 is provided with conductive traces and plated through holes in accordance with the first embodiment of the present invention.

Referring now to FIG. 29, first conductive traces 315 and second conductive traces 325 are respectively formed on the first insulating layer 312 and the second insulating layer 322 by depositing a first plated layer 31' on the first metal sheet 31 and into the first via openings 313, depositing a second plated layer 32' on the second metal sheet 32 and into the second via openings 323, and then patterning the first and second metal sheets 31, 32 as well as the first and second plated layers 31', 32' thereon. Alternatively, when no first and second metal sheets 31, 32 are laminated on the first and second insulating layers 312, 322 in the previous process, the first and second insulating layers 312, 322 can be directly metallized to form the first and second conductive traces 315, 325. The first conductive traces 315 extend from the first insulating layer 312 in the downward direction, extend laterally on the first insulating layer 312 and extend into the first via openings 313 in the upward direction to form the first conductive vias 317 in direct contact with the first contact pads 112 of the interposer 11'. As a result, the first conductive traces 315 can provide horizontal signal routing in both the X and Y directions and vertical routing through the first via openings 313 and serve as electrical connections for the interposer 11'. The second conductive traces 325 extend from the second insulating layer 322 in the upward direction, extend laterally on the second insulating layer 322 and extend into the second via openings 323 in the downward direction to form the second conductive vias 327 in direct contact with selected portions of the metallic heat spreader 22. Accordingly, the second conductive traces 325 can provide ground connection and thermal dissipation pathway for the metallic heat spreader 22.

Also shown in FIG. 29 is a connecting layer 403 deposited in the through holes 401 to provide the plated through holes 411. The connecting layer 403 is a hollow tube that covers the inner sidewall of the through holes 401 in lateral directions and extends vertically to electrically connect the first conductive traces 315 and the second conductive traces 325. Alternatively, the connecting layer 403 can fill the through holes 401. In this case, the plated through hole 411 becomes a metal post and there is no space for an insulative filler in the through holes 401.

The first and second plated layer 31', 32' and the connecting layer 403 can be deposited by any of numerous techniques including electroplating, electroless plating, evaporating, sputtering, and their combinations, as a single layer or multiple layers. For instance, they can be deposited by first dipping the structure in an activator solution to render the first and second insulating layers 312, 322 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first and second conductive traces 315, 325 by any of numerous techniques including wet etching, electro-chemical etching, laser-assist etching, and their combinations, with an etch masks (not shown) thereon that define the first and second conductive traces 315, 325. Preferably, the first and second plated layer 31', 32' and the connecting layer 403 are formed of the same material deposited simultaneously in the same manner and have the same thickness.

The first and second metal sheets 31, 32, the first and second plated layers 31', 32' and the connecting layer 403 are shown as a single layer for convenience of illustration. The boundary between the metal layers may be difficult or impossible to detect since copper is plated on copper. However, the boundaries between the first plated layer 31' and the first insulating layer 312, between the second plated layer 32' and the second insulating layer 322, between the connecting layer 403 and the first insulating layer 312, between the connecting layer 403 and the balancing layer 311, between the connecting layer 403 and the core layer 26, and between the connecting layer 403 and the second insulating layer 322 are clear.

Figure 30:
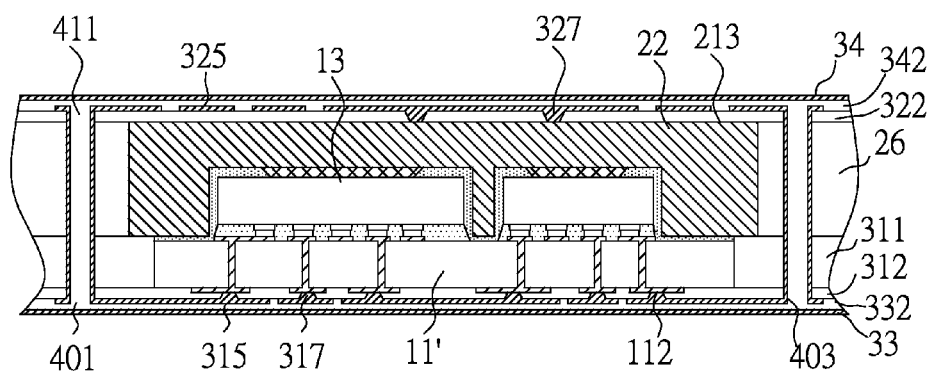
FIG. 30 is a cross-sectional view showing a state in which laminated layers are disposed on the structure of FIG. 29 in accordance with the first embodiment of the present invention.

FIG. 30 is a cross-sectional view of the structure with a third insulating layer 332 and a third metal sheet 33 laminated/coated on the first insulating layer 312 and the first conductive traces 315, and a fourth insulating layer 342 and a fourth metal sheet 34 laminated/coated on the second insulating layer 322 and the second conductive traces 325. The third insulating layer 332 is sandwiched between the first insulating layer 312/the first conductive traces 315 and the third metal sheet 33 and extends into the remaining space of the through holes 401 in the upward direction. Likewise, the fourth insulating layer 342 is sandwiched between the second insulating layer 322/the second conductive traces 325 and the fourth metal sheet 34 and extends into the remaining space of the through holes 401 in the downward direction. The third and fourth insulating layers 332, 342 can be formed of epoxy resin, glass-epoxy, polyimide and the like and typically has a thickness of 50 microns. The third and fourth metal sheets 33, 34 are respectively illustrated as a copper layer with a thickness of 25 microns. Preferably, the first, second, third and fourth insulating layers 312, 322, 332, 342 are formed of the same material.

Figure 31:
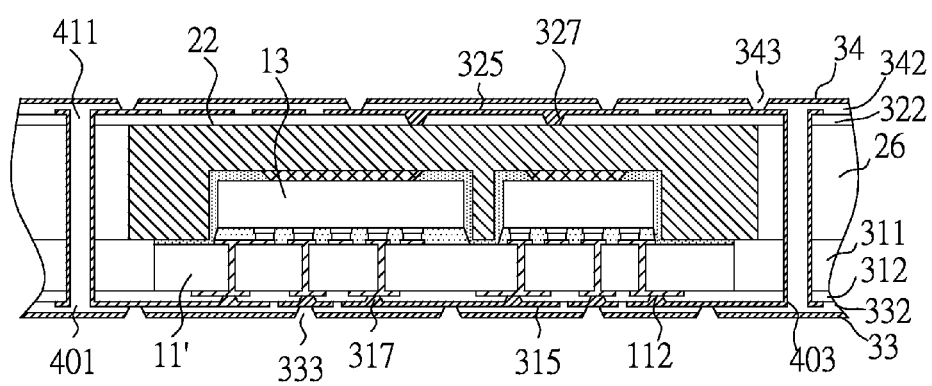
FIG. 31 is a cross-sectional view showing a state in which the structure of FIG. 30 is provided with via openings in accordance with the first embodiment of the present invention.

FIG. 31 is a cross-sectional view of the structure provided with the third and fourth via openings 333, 343 to expose selected portions of the first and second conductive traces 315, 325. The third via openings 333 extend through the third metal sheet 33 and the third insulating layer 332, and are aligned with selected portions of the first conductive traces 315. The fourth via openings 343 extend through the fourth metal sheet 34 and the fourth insulating layer 342, and are aligned with selected portions of the second conductive traces 325. Like the first and second via openings 313, 323, the third and fourth via openings 333, 343 can be formed by any of numerous techniques including laser drilling, plasma etching and photolithography and typically have a diameter of 50 microns. Preferably, the first, second, third and fourth via openings 313, 323, 333, 343 have the same size.

Referring now to FIG. 32, the third conductive traces 335 and fourth conductive traces 345 are respectively formed on the third insulating layer 332 and the fourth insulating layer 342 by depositing a third plated layer 33' on the third metal sheet 33 and into the third via openings 333, depositing a fourth plated layer 34' on the fourth metal sheet 34 and into the fourth via openings 343, and then patterning the third and fourth metal sheets 33, 34 as well as the third and fourth plated layers 33', 34' thereon. Alternatively, when no third and fourth metal sheets 33, 34 are laminated on the third and fourth insulating layers 332, 342 in the previous process, the third and fourth insulating layers 332, 342 can be directly metallized to form the third and fourth conductive traces 335, 345. The third conductive traces 335 extend from the third insulating layer 332 in the downward direction, extend laterally on the third insulating layer 332 and extend into the third via openings 333 in the upward direction to form the third conductive vias 337 in direct contact with the first conductive traces 315. The fourth conductive traces 345 extend from the fourth insulating layer 342 in the upward direction, extend laterally on the fourth insulating layer 342 and extend into the fourth via openings 343 in the downward direction to form the fourth conductive vias 347 in direct contact with the second conductive traces 325. Preferably, the first, second, third and fourth conductive traces 315, 325, 335, 345 are formed of the same material with the same thickness.

Accordingly, as shown in FIG. 32, a semiconductor package 110 is accomplished and includes an interposer 11', chips 13, a metallic heat spreader 22, a core layer 26, a first buildup circuitry 301, a second buildup circuitry 302, and plated through holes 411. In this illustration, the first buildup circuitry 301 includes a balancing layer 311, a first insulating layer 312, first conductive traces 315, a third insulating layer 332 and third conductive traces 335; and the second buildup circuitry 302 includes a second insulating layer 322, second conductive traces 325, a fourth insulating layer 342 and fourth conductive traces 345. The chips 13 are electrically coupled to the pre-fabricated interposer 11' by flip chip process to form a chip-on-interposer subassembly 10. The chip-on-interposer subassembly 10 is attached to the metallic heat spreader 22 using first and second adhesives 191, 193 with the chips 13 positioned within the cavities 215 and the interposer 11' laterally extending beyond the cavities 215. The first adhesive 191 provides mechanical bonds and thermal connection between the chips 13 and the metallic heat spreader 22, and the second adhesive 193 provides mechanical bonds between the chips 13 and the metallic heat spreader 22 and between the interposer 11' and the metallic heat spreader 22. The core layer 26 laterally covers the sidewalls of the metallic heat spreader 22. The first buildup circuitry 301 is electrically coupled to the interposer 11' through the first conductive vias 317 in direct contact with the first contact pads 112 of the interposer 11', and thus the electrical connection between the interposer 11' and the first buildup circuitry 301 is devoid of soldering material. The second buildup circuitry 302 is electrically and thermally coupled to the metallic heat spreader 22 through the second conductive vias 327 that can serve as heat pipes for dissipating heat from the metallic heat spreader 22 to the outer conductive layer of the second buildup circuitry 302. The plated through holes 411 are essentially shared by the core layer 26, the first buildup circuitry 301 and the second buildup circuitry 302, and provide electrical and thermal connections between the first buildup circuitry 301 and the second buildup circuitry 302.

Figure 33:
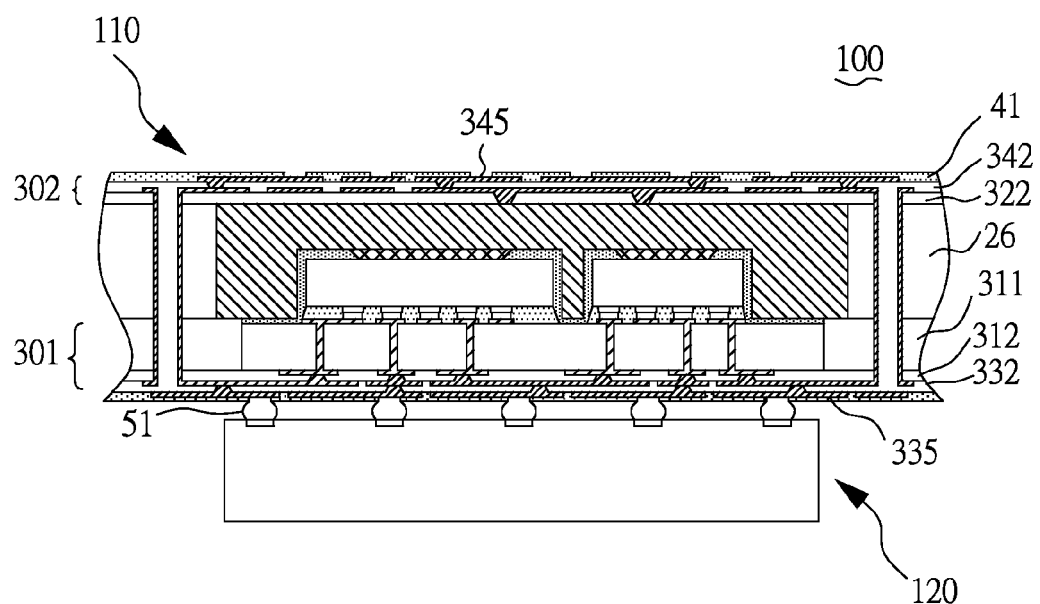
FIG. 33 is a cross-sectional view showing a package-on-package assembly with another semiconductor package mounted on the semiconductor package of FIG. 32 in accordance with the first embodiment of the present invention.

FIG. 33 is a cross-sectional view of a package-on-package assembly 100 with another semiconductor package 120 mounted on the first buildup circuitry 301 of the semiconductor package 110 illustrated in FIG. 32. The semiconductor package 120 can be any type of package. For instance, the semiconductor package 120 may be a conventional IC package or anyone package conceived by the present invention. In this illustration, the semiconductor package 110 is further provided with solder mask material 41 on the first and second buildup circuitries 301, 302. The solder mask material 41 includes solder mask openings to expose selected portions of the third and fourth conductive traces 335, 345. Accordingly, the semiconductor package 120 is mounted on the exposed portions of the third conductive traces 335 of the semiconductor package 110 via solder balls 51.

Embodiment 2

FIGS. 34-43 are cross-sectional views showing a method of making another semiconductor package with package-on-package stacking capability which has an alignment guide for interposer attachment and metallic posts for ground connection in accordance with another embodiment of the present invention.

For purposes of brevity, any description in Embodiment 1 above is incorporated herein insofar as the same is applicable, and the same description need not be repeated.

Figure 34:
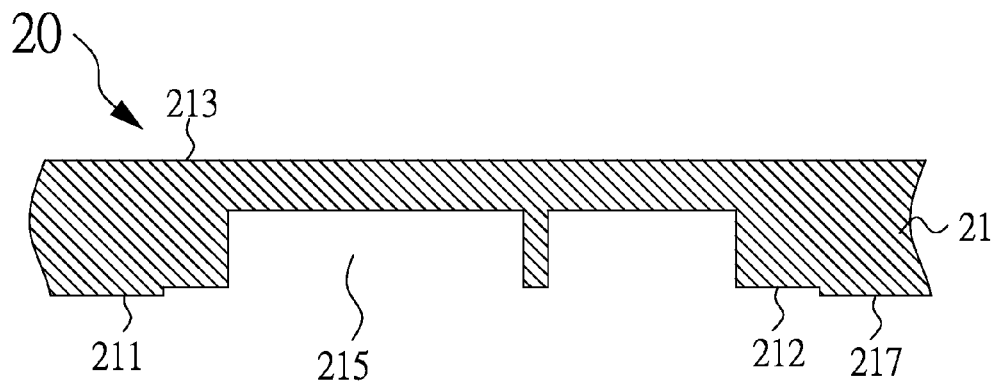
FIG. 34 is a cross-sectional view showing a metallic carrier in accordance with the second embodiment of the present invention.

FIG. 34 is a cross-sectional view of a metallic carrier 20 with an alignment guide 217 around the entrance of the cavities 215. The alignment guide 217 can be formed by removing selected portions of a metal plate 21 or by pattern deposition of a metal or plastic material on the metal plate 21 at the first surface 211. Plating, etching or mechanical carving is typically used to form the alignment guide 217. Accordingly, the alignment guide 217 extends from the flat surface 212 of the metallic carrier 20 adjacent to the cavity entrance in the downward direction and can have a thickness of 5 to 200 microns. In this embodiment, the alignment guide 217 with a thickness of 50 microns laterally extends to the peripheral edges of the metallic carrier 20 and has inner peripheral edges that conform to the four lateral sides of a subsequently disposed interposer.

Figure 35:
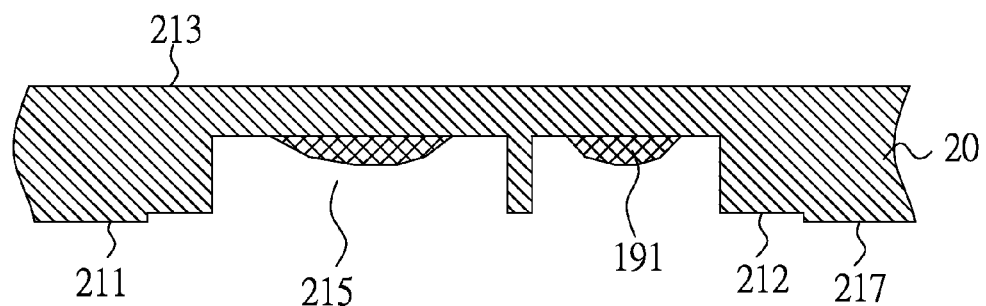
FIG. 35 is a cross-sectional view showing a state in which an adhesive is dispensed on the metallic carrier of FIG. 34 in accordance with the second embodiment of the present invention.

FIG. 35 is a cross-sectional view of the metallic carrier 20 with a first adhesive 191 dispensed in the cavities 215. The first adhesive 191 typically is a thermally conductive adhesive and dispensed on the cavity bottoms.

Figure 36:
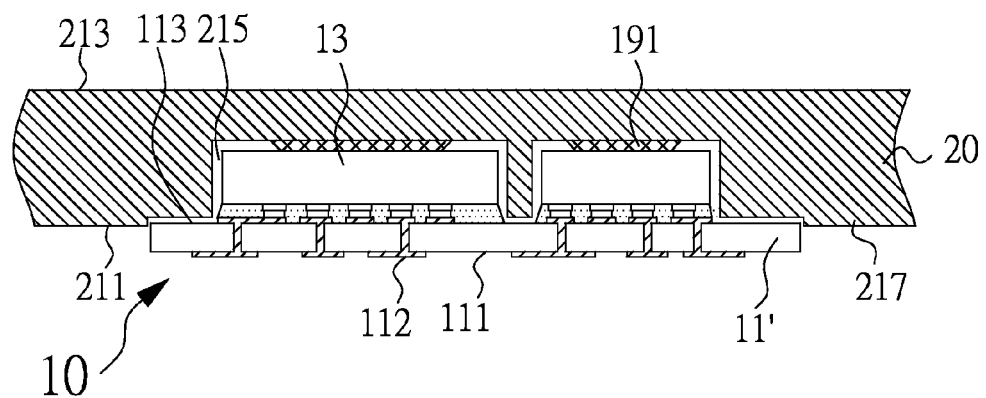
FIG. 36 is a cross-sectional view showing a state in which the chip-on-interposer subassembly of FIG. 8 is attached to the metallic carrier of FIG. 35 in accordance with the second embodiment of the present invention.

FIG. 36 is a cross-sectional view of the structure with a chip-on-interposer subassembly 10 attached to the metallic carrier 20 using the first adhesive 191. The interposer 11' and the chips 13 are attached to the metallic carrier 20 with the chips 13 inserted into the cavities 215 and the alignment guide 217 laterally aligned with and in close proximity to the peripheral edges of the interposer 11'. The interposer placement accuracy is provided by the alignment guide 217. The alignment guide 217 extends beyond the second surface 113 of the interposer 11' in the downward direction and is located beyond and laterally aligned with the four lateral surfaces of the interposer 11' in the lateral directions. As the alignment guide 217 is in close proximity to and conforms to the four lateral surfaces of the interposer 11' in lateral directions, any undesirable movement of the chip-on-interposer subassembly 10 due to adhesive curing can be avoided. Preferably, a gap in between the interposer 11' and the alignment guide 217 is in a range of about 5 to 50 microns. The interposer can also be attached without the alignment guide 217. Although the cavities 215 cannot provide placement accuracy for the chip-on-interposer subassembly 10 due to control difficulties in the cavity size and depth, it does not result in micro-via connection failure in the subsequent process of forming buildup circuitry on interposer 11' due to the larger pad size and pitch of the interposer 11'.

Figure 37:
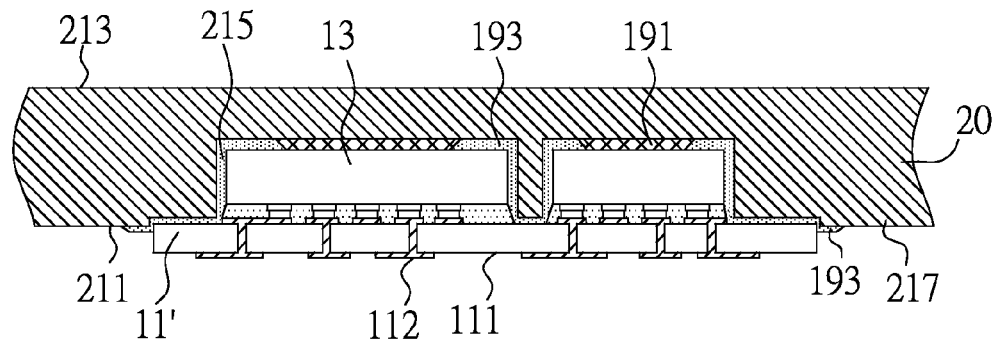
FIG. 37 is a cross-sectional view showing a state in which the structure of FIG. 36 is provided with another adhesive in accordance with the second embodiment of the present invention.

FIG. 37 is a cross-sectional view of the structure with a second adhesive 193 that fills the space between the interposer 11' and the metallic carrier 20 and further extends into the cavities 215. The second adhesive 193 typically is an electrically insulating underfill and dispensed into the space between the interposer 11' and the metallic carrier 20 and the remaining spaces within the cavities 215.

Figure 38:
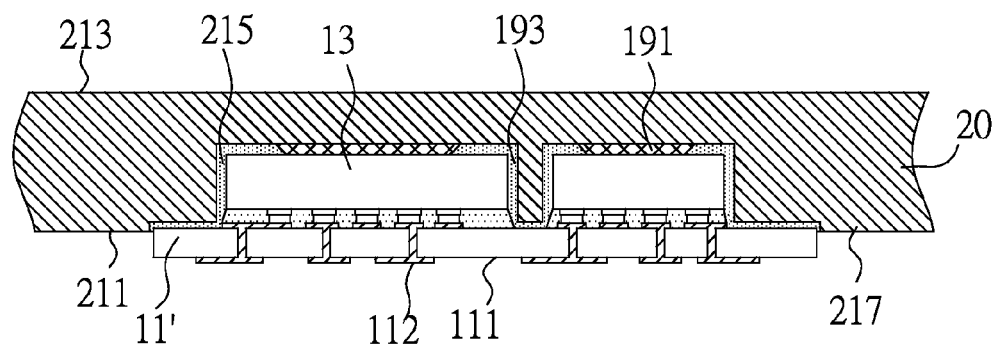
FIG. 38 is a cross-sectional view showing a state in which excess adhesive is removed from the structure of FIG. 37 in accordance with the second embodiment of the present invention.

FIG. 38 is a cross-sectional view of the structure after removal of excess adhesive that overflows onto the alignment guide 217. As an alternative, the step of removing excess adhesive may be omitted, and the excess adhesive becomes a portion of the subsequent buildup circuitry.

Figure 39:
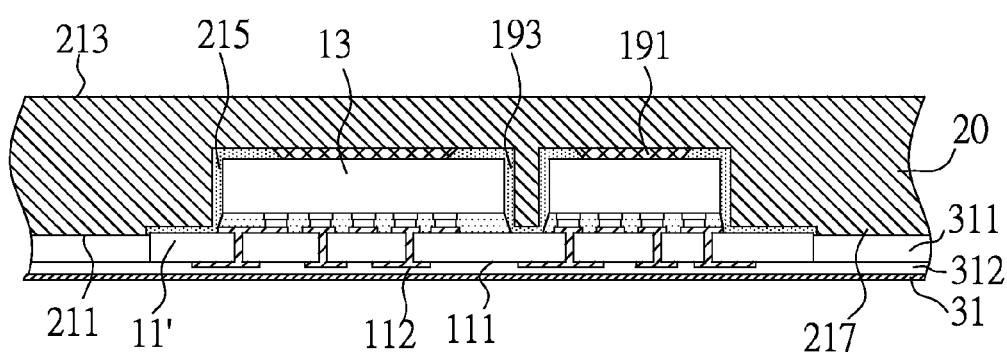
FIG. 39 is a cross-sectional view showing a state in which laminated layers are disposed on the structure of FIG. 38 in accordance with the second embodiment of the present invention.

FIG. 39 is a cross-sectional view of the structure with a balancing layer 311, a first insulating layer 312 and a first metal sheet 31 laminated/coated on the interposer 11' and the metallic carrier 20. The balancing layer 311 contacts and extends from the metallic carrier 20 in the downward direction and laterally covers and surrounds and conformally coats the sidewalls of the interposer 11' and extends laterally from the interposer 11' to the peripheral edges of the structure. The first insulating layer 312 contacts and provides robust mechanical bonds between the first metal sheet 31 and the interposer 11' and between the first metal sheet 31 and the balancing layer 311.

Figure 40:
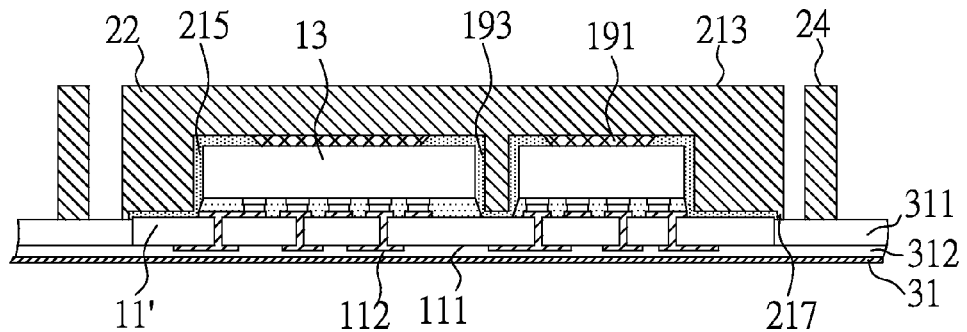
FIG. 40 is a cross-sectional view showing a state in which a metallic heat spreader and metallic posts are formed from the structure of FIG. 39 in accordance with the second embodiment of the present invention.

FIG. 40 is a cross-sectional view of the structure with a metallic heat spreader 22 and metallic posts 24 formed by selectively removing portions of the metallic carrier 20 using photolithography and wet etching. The metallic heat spreader 24, corresponding to the first remaining portion of the metallic carrier 20, covers and encloses the chips 13 within the cavities 215 in the upward direction. The metallic posts 24, corresponding to the second remaining portions of the metallic carrier 20, are spaced from the metallic heat spreader 22. In this illustration, the metallic posts 24 are coplanar with the second surface 213 of the metallic heat spreader 22 in the upward direction and coplanar with the alignment guide 217 in the downward direction.

Figure 41:
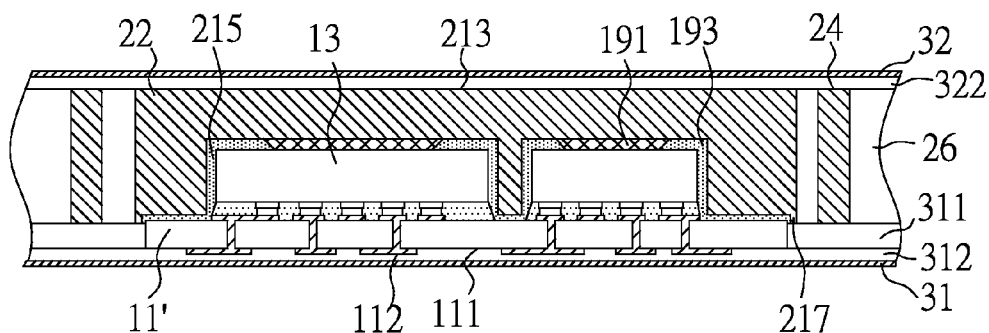
FIG. 41 is a cross-sectional view showing a state in which laminated layers are disposed on the structure of FIG. 40 in accordance with the second embodiment of the present invention.

FIG. 41 is a cross-sectional view of the structure with a core layer 26, a second insulating layer 322 and a second metal sheet 32 laminated/coated on the metallic heat spreader 22, the metallic posts 24 and the balancing layer 311 in the upward direction. The core layer 26 contacts and extends from the balancing layer 311 in the upward direction and laterally covers and surrounds and conformally coats the sidewalls of the metallic heat spreader 22 and the metallic posts 24, and extends laterally from the metallic heat spreader 22 and the metallic posts 24 to the peripheral edges of the structure. The second insulating layer 322 contacts and covers and extends laterally on the second surface 213 of the metallic heat spreader 22, the metallic posts 24 and the core layer 26 in the upward direction. The second metal sheet 32 contacts and covers the second insulating layer 322 in the upward direction.

Figure 42:
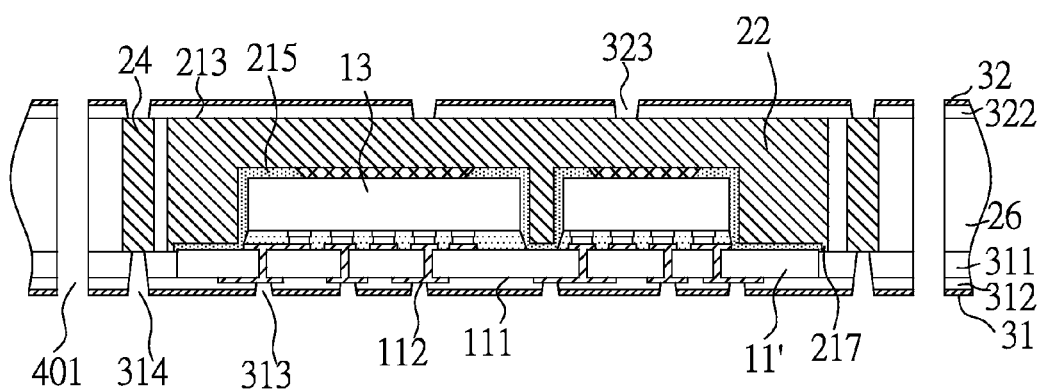
FIG. 42 is a cross-sectional view showing a state in which the structure of FIG. 41 is provided with via openings and through holes in accordance with the second embodiment of the present invention.

FIG. 42 is a cross-sectional view of the structure provided with first via openings 313, 314, second via openings 323 and through holes 401. The first via openings 313 extend through the first metal sheet 31 and the first insulating layer 312 and are aligned with the first contact pads 112 of the interposer 11'. Further, additional first via openings 314 extend through the first metal sheet 31, the first insulating layer 312 and the balancing layer 311 and are aligned with the metallic posts 24. The second via openings 323 extend through the second metal sheet 32 and the second insulating layer 322 and are aligned with selected portions of the metallic heat spreader 22 and the metallic posts 24. The through holes 401 extend though the first metal sheet 31, the first insulating layer 312, the balancing layer 311, the core layer 26, the second insulating layer 322 and the second metal sheet 32 in vertical directions.

Figure 43:
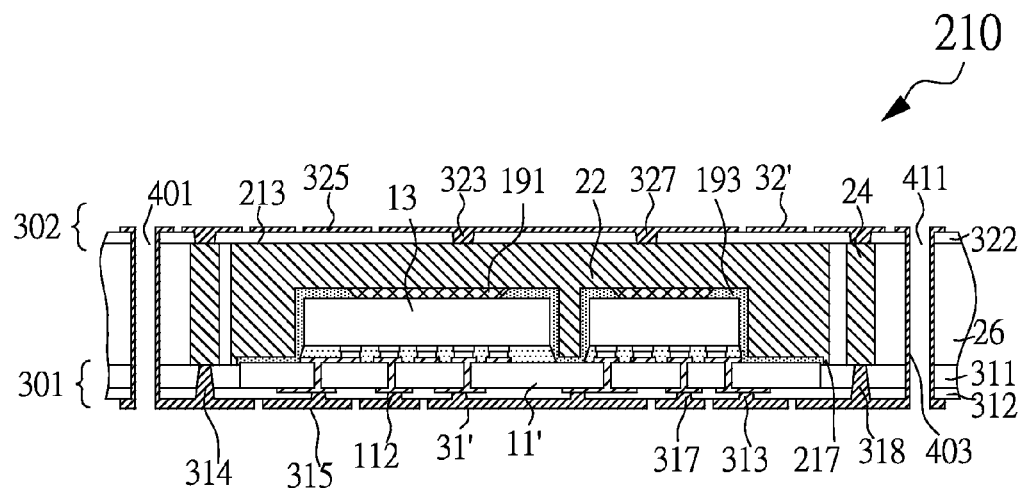
FIG. 43 is a cross-sectional view showing with a state in which the structure of FIG. 42 is provided with conductive traces and plated through holes to finish the fabrication of a semiconductor package in accordance with the second embodiment of the present invention.

Referring now to FIG. 43, first conductive traces 315 and second conductive traces 325 are respectively formed on the first insulating layer 312 and the second insulating layer 322 by depositing a first plated layer 31' on the first metal sheet 31 and into the first via openings 313, 314, depositing a second plated layer 32' on the second metal sheet 32 and into the second via openings 323, and then patterning the first and second metal sheets 31, 32 as well as the first and second plated layers 31', 32' thereon. Also, a connecting layer 403 is deposited in the through holes 401 to provide plated through holes 411. The first conductive traces 315 extend from the first insulating layer 312 in the downward direction, extend laterally on the first insulating layer 312 and extend into the first via openings 313, 314 in the upward direction to form first conductive vias 317, 318 in direct contact with the first contact pads 112 of the interposer 11' and the metallic posts 24, thereby providing signal routings for the interposer 11' and ground connection. The second conductive traces 325 extend from the second insulating layer 322 in the upward direction, extend laterally on the second insulating layer 322 and extend into the second via openings 323 in the downward direction to form second conductive vias 327 in direct contact with selected portions of the metallic heat spreader 22 and the metallic posts 24 for ground connection. The plated through holes 411 at the first end extend to the first conductive traces 315 and at the second end extend to the second conductive traces 325 to provide a vertical signal connection pathway.

Accordingly, as shown in FIG. 43, a semiconductor package 210 is accomplished and includes an interposer 11', chips 13, a metallic heat spreader 22, metallic posts 24, a core layer 26, a first buildup circuitry 301, a second buildup circuitry 302 and plated through holes 411. In this illustration, the first buildup circuitry 301 includes a balancing layer 311, a first insulating layer 312 and first conductive traces 315; and the second buildup circuitry 302 includes a second insulating layer 322 and second conductive traces 325. The chips 13 are electrically coupled to the pre-fabricated interposer 11' by flip chip process to form a chip-on-interposer subassembly 10. The chip-on-interposer subassembly 10 is attached to the metallic heat spreader 22 using first and second adhesives 191, 193 with the chips 13 positioned within the cavities 215 and the interposer 11' laterally extending beyond the cavities 215. The first adhesive 191 provides mechanical bonds and thermal connection between the chips 13 and the metallic heat spreader 22, and the second adhesive 193 provides mechanical bonds between the chips 13 and the metallic heat spreader 22 and between the interposer 11' and the metallic heat spreader 22. The alignment guide 217 of the metallic heat spreader 22 extends beyond the second surface 113 of the interposer 11' in the downward direction and is in close proximity to the peripheral edges of the interposer 11' to provide critical placement accuracy for the interposer 11'. The metallic posts 24 are spaced from the metallic heat spreader 22, and coplanar with the metallic heat spreader 22 in the upward direction and coplanar with the alignment guide 217 in the downward direction. The core layer 26 laterally covers the sidewalls of the metallic heat spreader 22 and the metallic posts 24. The first buildup circuitry 301 is electrically coupled to the interposer 11' and the metallic posts 24 through the first conductive vias 317, 318. The second buildup circuitry 302 is electrically and thermally coupled to the metallic heat spreader 22 and is electrically coupled to the metallic posts 24 through the second conductive vias 327. The plated through holes 411 are electrically coupled to the first and second conductive traces 315, 325 to provide the semiconductor package with stacking capacity.

Figure 44:
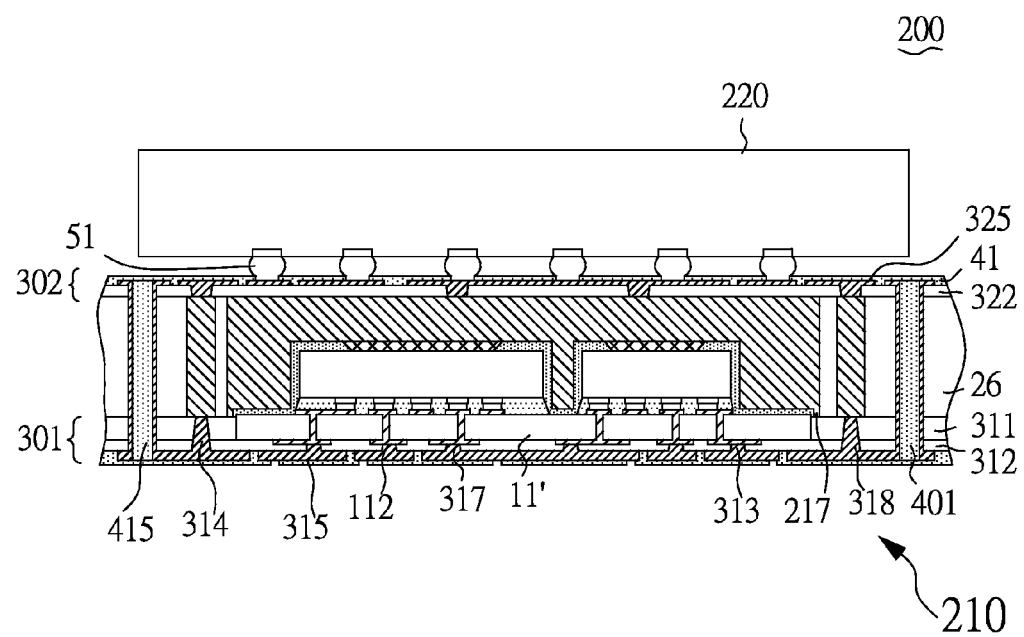
FIG. 44 is a cross-sectional view showing a package-on-package assembly with another semiconductor package mounted on the semiconductor package of FIG. 43 in accordance with the second embodiment of the present invention.

FIG. 44 is a cross-sectional view of a package-on-package assembly 200 with another semiconductor package 220 mounted on the second buildup circuitry 302 of the semiconductor package 210 illustrated in FIG. 43. In this illustration, the semiconductor package 210 is further provided with an insulative filler 415 in the remaining space of the through holes 401 and solder mask material 41 on the first and second buildup circuitries 301, 302. The solder mask material 41 includes solder mask openings to expose selected portions of the first conductive traces 315 and the second conductive traces 325. Accordingly, the semiconductor package 220 is mounted on the exposed portions of the second conductive traces 325 of the semiconductor package 210 via solder balls 51.

Embodiment 3

FIGS. 45-52 are cross-sectional views showing a method of making yet another semiconductor package with package-on-package stacking capability which includes a metallic heat spreader laterally extending to the peripheral edges of the package in accordance with yet another embodiment of the present invention.

For purposes of brevity, any description in above the aforementioned Embodiments is incorporated herein insofar as the same is applicable, and the same description need not be repeated.

Figure 45:
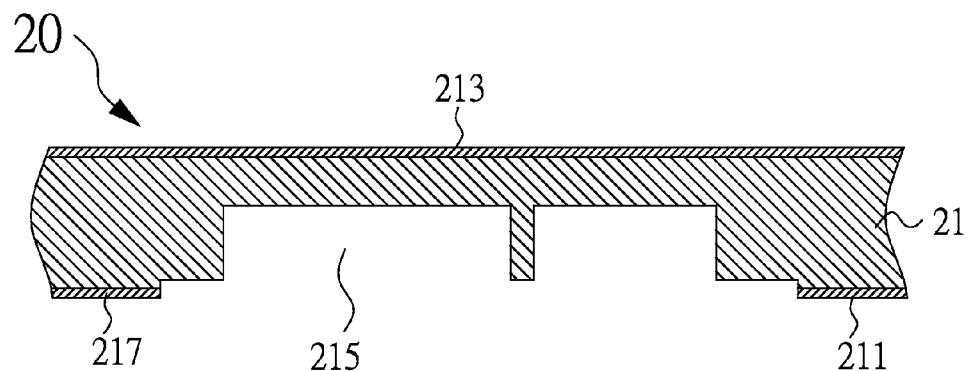
FIG. 45 is a cross-sectional view showing a metallic carrier in accordance with the third embodiment of the present invention.

FIG. 45 is a cross-sectional view of a metallic carrier 20 with cavities 215 at a first surface 211 and an alignment guide 217 around the entrance of the cavities 215. The alignment guide 217 can be formed by removing selected portions of a metal plate 21 or by pattern deposition on the metal plate 21, including electroplating, electroless plating, evaporating, sputtering and their combinations using photolithographic process. In this embodiment, the alignment guide 217 is formed by pattern deposition on the metal plate 21 and laterally extends to the peripheral edges of the metallic carrier 20 and has inner peripheral edges that conform to four sides of a subsequently disposed interposer.

Figure 46:
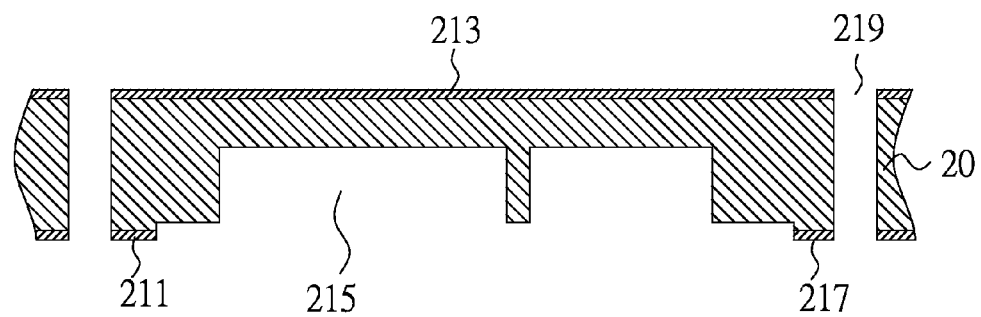
FIG. 46 is a cross-sectional view showing a state in which the metallic carrier of FIG. 45 is provided with through openings in accordance with the third embodiment of the present invention.

FIG. 46 is a cross-sectional view of the metallic carrier 20 provided with through openings 219 beyond the cavities 215. The through openings 219 extend through the metallic carrier 20 between the first surface 211 and the second surface 213 in the vertical directions and can be formed by mechanical drilling.

Figure 47:
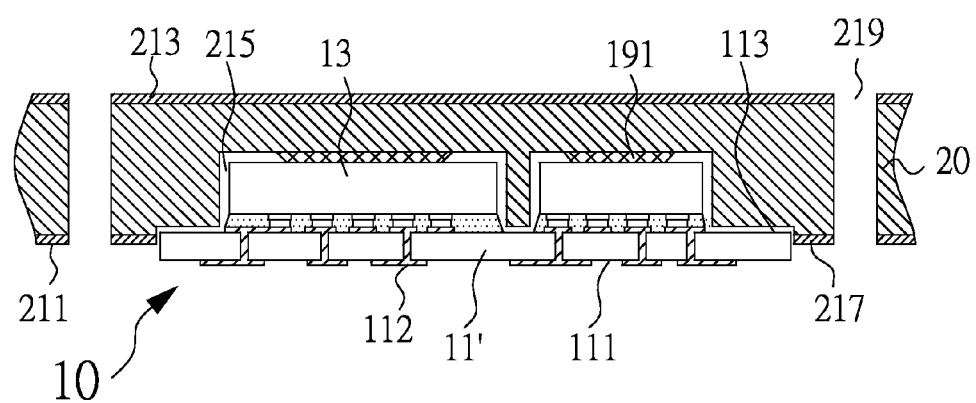
FIG. 47 is a cross-sectional view showing a state in which the chip-on-interposer subassembly of FIG. 8 is attached to the metallic carrier of FIG. 46 in accordance with the third embodiment of the present invention.

FIG. 47 is a cross-sectional view of the structure with a chip-on-interposer subassembly 10 attached to the metallic carrier 20 using a first adhesive 191. The interposer 11' and the chips 13 are attached to the metallic carrier 20 with the chips 13 inserted into the cavities 215 and the alignment guide 217 laterally aligned with and in close proximity to the peripheral edges of the interposer 11'. The first adhesive 191 contacts the cavity bottoms and the chips 13, thereby providing mechanical bonds and thermal connection between the chips 13 and the metallic carrier 20. The alignment guide 217 extends beyond the second surface 113 of the interposer 11' in the downward direction and is in close proximity to the peripheral edges of the interposer 11' to provide critical placement accuracy for the interposer 11'.

Figure 48:
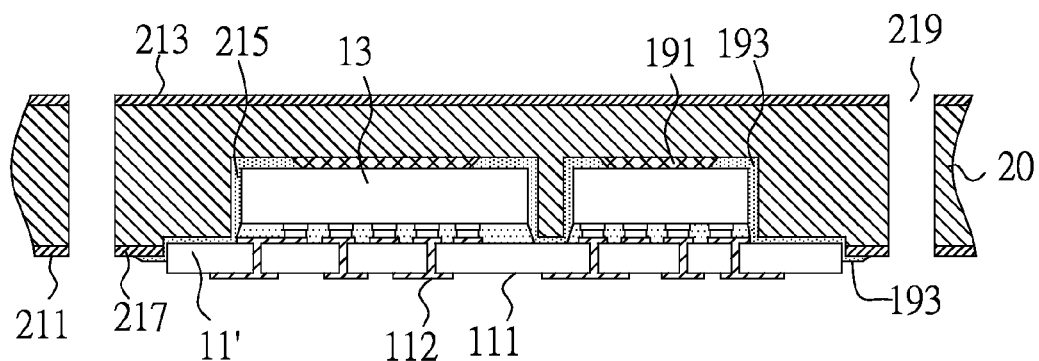
FIG. 48 is a cross-sectional view showing a state in which the structure of FIG. 47 is provided with another adhesive in accordance with the third embodiment of the present invention.

FIG. 48 is a cross-sectional view of the structure with a second adhesive 193 that fills the space between the interposer 11' and the metallic carrier 20 and further extends into the cavities 215. The second adhesive 193 typically is an electrically insulating underfill and dispensed into the space between the interposer 11' and the metallic carrier 20 and the remaining spaces within the cavities 215.

Figure 49:
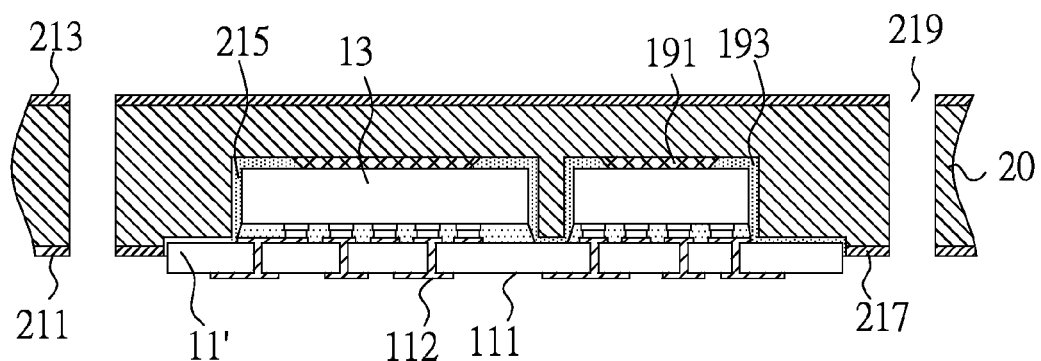
FIG. 49 is a cross-sectional view showing a state in which excess adhesive is removed from the structure of FIG. 48 in accordance with the third embodiment of the present invention.

FIG. 49 is a cross-sectional view of the structure after removal of excess adhesive that overflows onto the alignment guide 217. As an alternative, the step of removing excess adhesive may be omitted, and the excess adhesive becomes a portion of the subsequent buildup circuitry.

Figure 50:
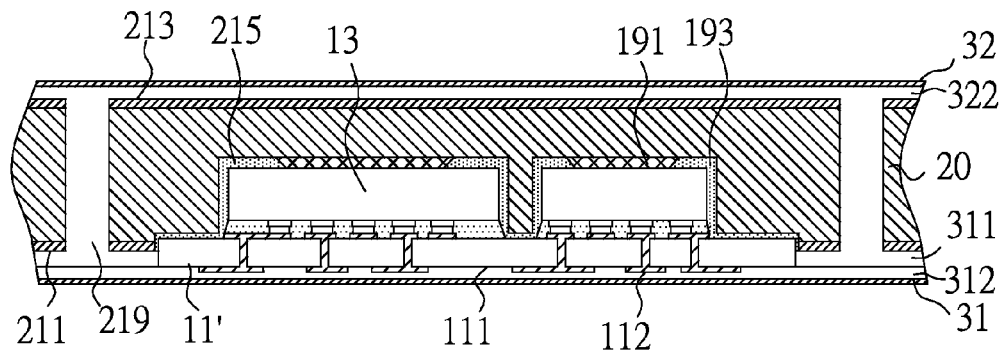
FIG. 50 is a cross-sectional view showing a state in which laminated layers are disposed on the structure of FIG. 49 in accordance with the third embodiment of the present invention.

FIG. 50 is a cross-sectional view of the structure with a balancing layer 311, a first insulating layer 312 and a first metal sheet 31 laminated/coated on the interposer 11' and the metallic carrier 20, and a second insulating layer 322 and a second metal sheet 32 laminated/coated on the second surface 213 of the metallic carrier 20. The balancing layer 311 contacts and extends from the metallic carrier 20 in the downward direction, extends into the through openings 219 in the upward direction, laterally covers and surrounds and conformally coats the sidewalls of the interposer 11' and extends laterally from the interposer 11' to the peripheral edges of the structure. The first insulating layer 312 extends laterally on the first surface 111 of the interposer 11' and the balancing layer 311 and contacts and provides robust mechanical bonds between the first metal sheet 31 and the interposer 11' and between the first metal sheet 31 and the balancing layer 311. The second insulating layer 322 extends laterally on the second surface 213 of the metal carrier 20 and contacts and provides robust mechanical bonds between the second metal sheet 32 and the metallic carrier 20.

Figure 51:
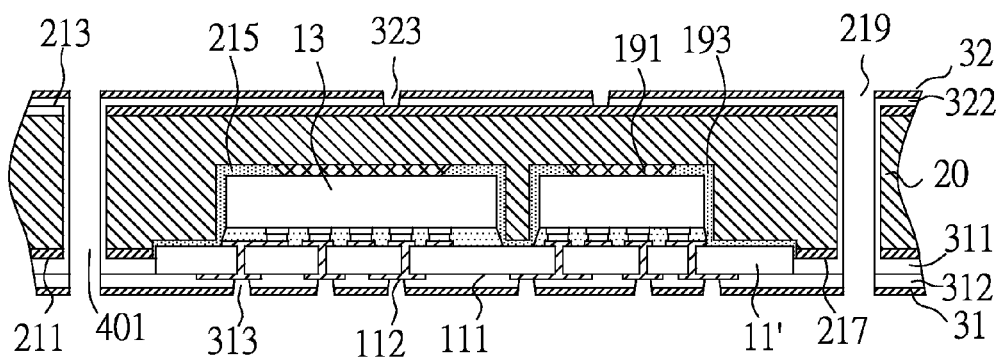
FIG. 51 is a cross-sectional view showing a state in which the structure of FIG. 50 is provided with via openings and through holes in accordance with the third embodiment of the present invention.

FIG. 51 is a cross-sectional view of the structure provided with first and second via openings 313, 323 and through holes 401. The first via openings 313 extend through the first metal sheet 31 and the first insulating layer 312 and are aligned with the first contact pads 112 of the interposer 11'. The second via openings 323 extend through the second metal sheet 32 and the second insulating layer 322 and are aligned with selected portions of the metallic carrier 20. The through holes 401 are aligned with the through openings 219 and extend though the first metal sheet 31, the first insulating layer 312, the balancing layer 311, the second insulating layer 322 and the second metal sheet 32 in vertical directions.

Figure 52:
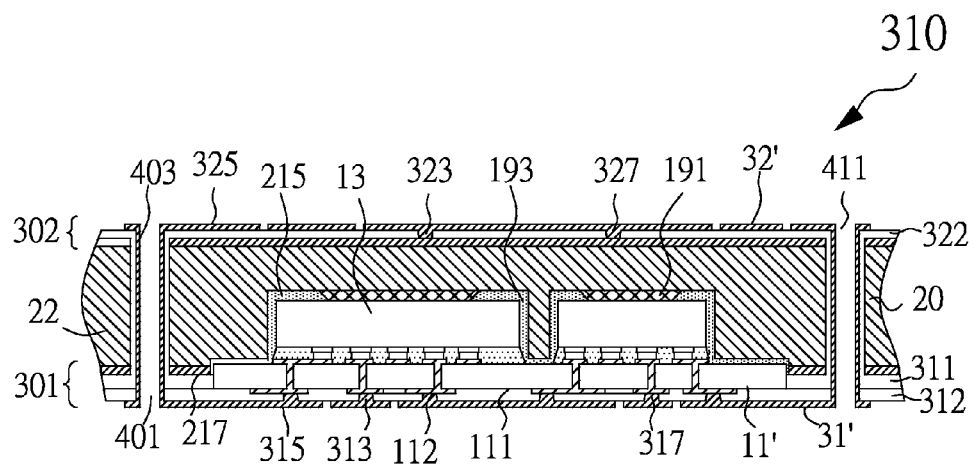
FIG. 52 is a cross-sectional view showing with a state in which the structure of FIG. 51 is provided with conductive traces and plated through holes to finish the fabrication of a semiconductor package in accordance with the third embodiment of the present invention.

Referring now to FIG. 52, the first conductive traces 315 and the second conductive traces 325 are respectively formed on the first insulating layer 312 and the second insulating layer 322 by depositing a first plated layer 31' on the first metal sheet 31 and into the first via openings 313, depositing a second plated layer 32' on the second metal sheet 32 and into the second via openings 323, and then patterning the first and second metal sheets 31, 32 as well as the first and second plated layers 31', 32' thereon. Also, a connecting layer 403 is deposited in the through holes 401 to provide the plated through holes 411. The first conductive traces 315 extend from the first insulating layer 312 in the downward direction, extend laterally on the first insulating layer 312 and extend into the first via openings 313 in the upward direction to form the first conductive vias 317 in direct contact with the first contact pads 112 of the interposer 11', thereby providing signal routings for the interposer 11'. The second conductive traces 325 extend from the second insulating layer 322 in the upward direction, extend laterally on the second insulating layer 322 and extend into the second via openings 323 in the downward direction to form the second conductive vias 327 in direct contact with selected portions of the metallic carrier 20 for heat dissipation and ground connection. The plated through holes 411 at the first end extend to the first conductive traces 315 and at the second end extend to the second conductive traces 325 to provide a vertical signal connection pathway.

Accordingly, as shown in FIG. 52, a semiconductor package 310 is accomplished and includes an interposer 11', chips 13, a metallic carrier 20, a first buildup circuitry 301, a second buildup circuitry 302 and plated through holes 411. In this illustration, the first buildup circuitry 301 includes a balancing layer 311, a first insulating layer 312 and first conductive traces 315; and the second buildup circuitry 302 includes a second insulating layer 322 and second conductive traces 325. The chips 13 are electrically coupled to the pre-fabricated interposer 11' by flip chip process to form a chip-on-interposer subassembly 10. The chip-on-interposer subassembly 10 is attached to the metallic carrier 20 which serves as a metallic heat spreader 22 using first and second adhesives 191, 193 with the chips 13 positioned within the cavities 215 and the interposer 11' laterally extending beyond the cavities 215. The first adhesive 191 provides mechanical bonds and thermal connection between the chips 13 and the metallic heat spreader 22, and the second adhesive 193 provides mechanical bonds between the chips 13 and the metallic heat spreader 22 and between the interposer 11' and the metallic heat spreader 22. The alignment guide 217 of the metallic heat spreader 22 extends beyond the second surface 113 of the interposer 11' in the downward direction and is in close proximity to the peripheral edges of the interposer 11' to provide critical placement accuracy for the interposer 11'. The first buildup circuitry 301 is electrically coupled to the interposer 11' through the first conductive vias 317. The second buildup circuitry 302 is electrically and thermally coupled to the metallic heat spreader 22 through the second conductive vias 327. The plated through holes 411 are essentially shared by the metallic carrier 20, the first buildup circuitry 301 and the second buildup circuitry 302, and extend through the through openings 219 of the metallic carrier 20 to provide electrical and thermal connections between the first buildup circuitry 301 and the second buildup circuitry 302.

Figure 53:
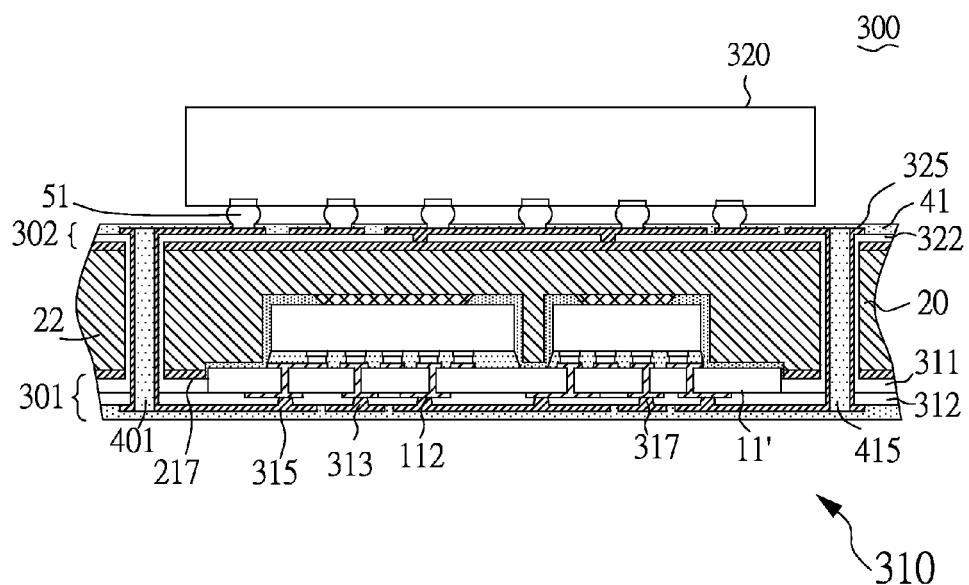
FIG. 53 is a cross-sectional view showing a package-on-package assembly with another semiconductor package mounted on the semiconductor package of FIG. 52 in accordance with the third embodiment of the present invention.

FIG. 53 is a cross-sectional view of a package-on-package assembly 300 with another semiconductor package 320 mounted on the second buildup circuitry 302 of the semiconductor package 310 illustrated in FIG. 52. In this illustration, the semiconductor package 310 is further provided with an insulative filler 415 in the remaining space of the through holes 401 and solder mask material 41 on the first and second buildup circuitries 301, 302. The solder mask material 41 includes solder mask openings to expose selected portions of the first and second conductive traces 315, 325. Accordingly, the semiconductor package 320 is mounted on the exposed portions of the second conductive traces 325 of the semiconductor package 310 via solder balls 51.

Embodiment 4

FIGS. 54-63 are cross-sectional views showing a method of making yet another semiconductor package with package-on-package stacking capability which uses a laminate substrate as the metallic heat spreader in accordance with yet another embodiment of the present invention.

For purposes of brevity, any description in the aforementioned Embodiments is incorporated herein insofar as the same is applicable, and the same description need not be repeated.

Figure 54:
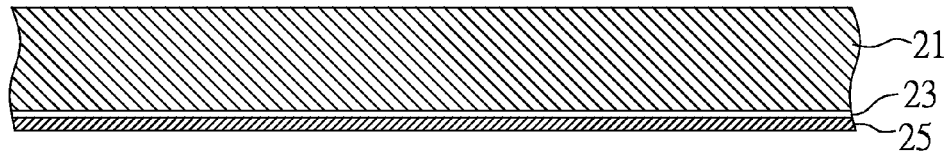
FIG. 54 is a cross-sectional view showing a laminate substrate in accordance with the fourth embodiment of the present invention.
Figure 55:
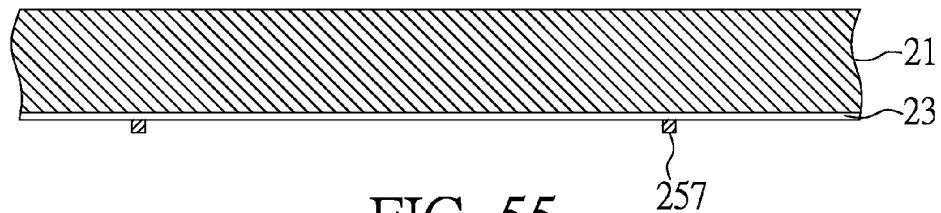
FIG. 55 is a cross-sectional view showing a state in which the laminate substrate of FIG. 54 is processed to form an alignment guide in accordance with the fourth embodiment of the present invention.

FIGS. 54 and 55 are cross-sectional views showing a process of forming an alignment guide on a dielectric layer of a laminate substrate in accordance with an embodiment of the present invention.

FIG. 54 is a cross-sectional view of a laminate substrate that includes a metal plate 21, a dielectric layer 23 and a metal layer 25. The dielectric layer 23 is sandwiched between the metal plate 21 and the metal layer 25. The dielectric layer 23 typically is made of epoxy resin, glass-epoxy, polyimide, and the like, and has a thickness of 50 microns. The metal layer 25 typically is made of copper, but copper alloys or other materials (such as aluminum, stainless steel or their alloys) may also be used. The thickness of the metal layer 25 can range from 5 to 200 microns. In this embodiment, the metal layer 25 is a copper plate with a thickness of 50 microns.

FIG. 55 is a cross-sectional view of the structure with an alignment guide 257 formed on the dielectric layer 23. The alignment guide 257 can be formed by removing selected portions of the metal layer 25 using photolithography and wet etching. In this illustration, the alignment guide 257 consists of plural metal posts in a rectangular frame array conforming to four lateral sides of a subsequently disposed interposer. However, the alignment guide patterns are not limited thereto and can be other various patterns against undesirable movement of the subsequently disposed interposer. For instance, the alignment guide 257 may consist of a continuous or discontinuous strip and conform to four sides, two diagonal corners or four corners of a subsequently disposed interposer.

Figure 56:
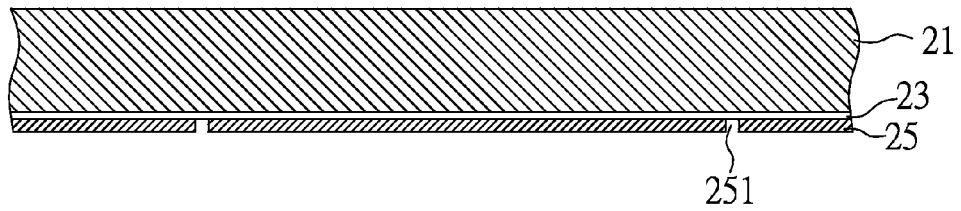
FIG. 56 is a cross-sectional view showing a laminate substrate with openings in accordance with the fourth embodiment of the present invention.
Figure 57:
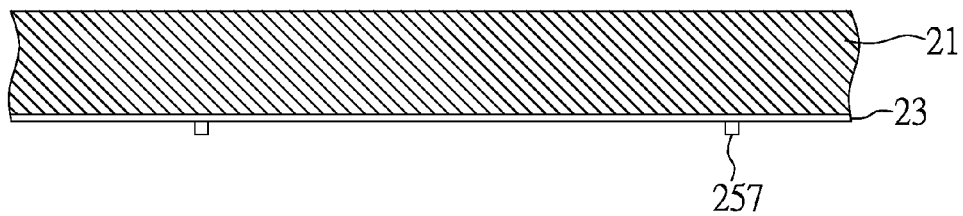
FIG. 57 is a cross-sectional view showing a state in which the laminate substrate of FIG. 56 is processed to form an alignment guide in accordance with the fourth embodiment of the present invention.

FIGS. 56 and 57 are cross-sectional views showing an alternative process of forming an alignment guide on a dielectric layer of a laminate substrate.

FIG. 56 is a cross-sectional view of a laminate substrate with a set of openings 251. The laminate substrate includes a metal plate 21, a dielectric layer 23 and a metal layer 25 as above mentioned, and the openings 251 are formed by removing selected portions of the metal layer 25.

FIG. 57 is a cross-sectional view of the structure with the alignment guide 257 formed on the dielectric layer 23. The alignment guide 257 can be formed by dispensing or printing a photosensitive plastic material (e.g., epoxy, polyimide, etc.) or non-photosensitive material into the openings 251, followed by removing the entire metal layer 25. Herein, the alignment guide 257 consists of plural resin posts and has a pattern against undesirable movement of a subsequently disposed interposer.

Figure 58:
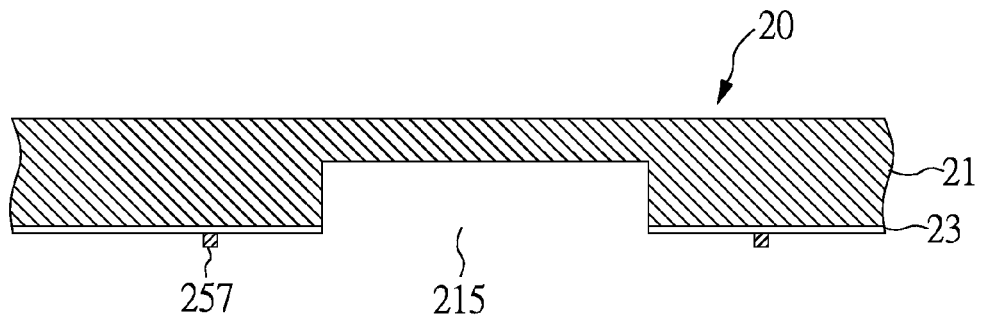
FIG. 58 is a cross-sectional view showing a state in which the laminate substrate of FIG. 55 is provided with a cavity to finish the fabrication of a metallic carrier in accordance with the fourth embodiment of the present invention.

FIG. 58 is a cross-sectional view of the metallic carrier 20 with a cavity 215. The cavity 215 extends through the dielectric layer 23 and further extends into the metal plate 21.

Figure 59:
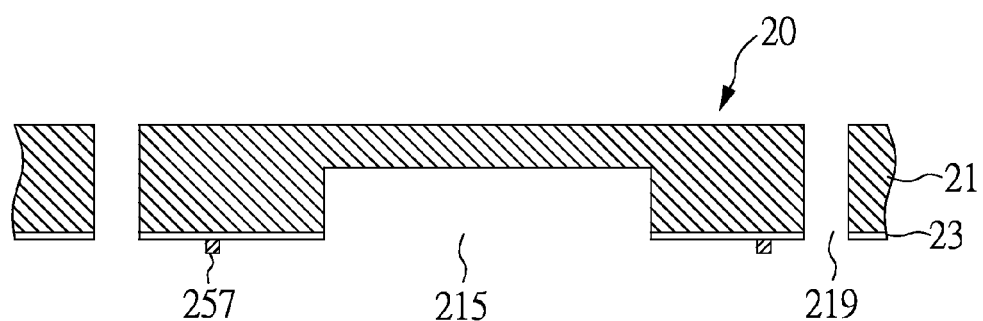
FIG. 59 is a cross-sectional view showing a state in which the metallic carrier of FIG. 58 is provided with through openings in accordance with the fourth embodiment of the present invention.

FIG. 59 is a cross-sectional view of the metallic carrier 20 provided with through openings 219 beyond the cavity 215. The through openings 219 extend through the metallic carrier 20 and can be formed by mechanical drilling.

Figure 60:
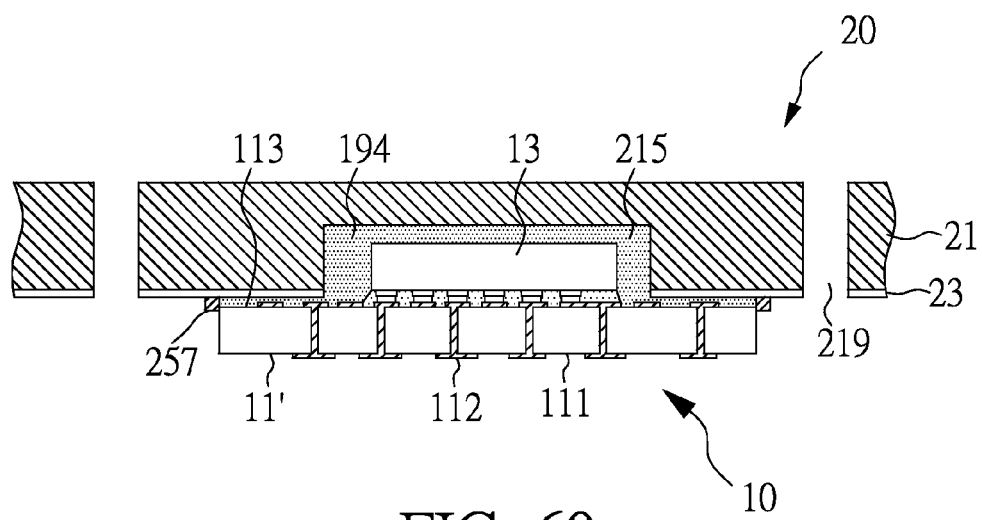
FIG. 60 is a cross-sectional view showing a state in which a chip-on-interposer subassembly is attached to the metallic heat spreader of FIG. 59 in accordance with the fourth embodiment of the present invention.

FIG. 60 is a cross-sectional view of the structure with a chip-on-interposer subassembly 10 attached to the metallic carrier 20 using an adhesive 194. The chip-on-interposer subassembly 10 is similar to that illustrated in FIG. 8, except that a single chip 13 is flip mounted on the interposer 11' in this illustration. The chip 13 is positioned within the cavity 215, and the interposer 11' is located beyond the cavity 215 with its second surface 113 attached on the dielectric layer 23. The chip 13 is mounted on the metallic carrier 20 by dispensing the adhesive 194 on the cavity bottoms, and then inserting the chip 13 of the chip-on-interposer subassembly 10 into the cavity 215. The adhesive 194 (typically a thermally conductive but electrically insulating adhesive) within the cavity 215 is compressed by the chip 13, flows downward into the gaps between the chip 13 and the cavity sidewalls, and overflows onto the flat surface of the dielectric layer 23. As a result, the adhesive 194 surrounds the embedded chip 13, and the squeezed out portion also serves as the interposer attach adhesive. The alignment guide 257 extends from the dielectric layer 23 and extends beyond the second surface 113 of the interposer 11' in the downward direction and is in close proximity to the peripheral edges of the interposer 11' to provide critical placement accuracy for the interposer 11'.

Figure 61:
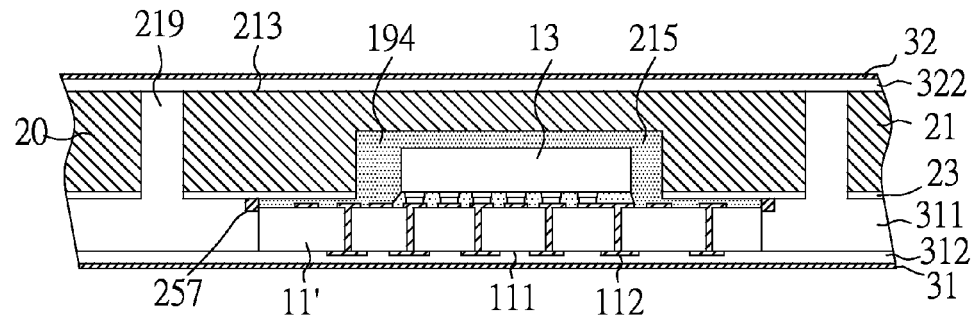
FIG. 61 is a cross-sectional view showing a state in which laminated layers are disposed on the structure of FIG. 60 in accordance with the fourth embodiment of the present invention.

FIG. 61 is a cross-sectional view of the structure with a balancing layer 311, a first insulating layer 312 and a first metal sheet 31 laminated/coated on the interposer 11' and the metallic carrier 20, and a second insulating layer 322 and a second metal sheet 32 laminated/coated on the second surface 213 of the metallic carrier 20. The balancing layer 311 contacts and covers the dielectric layer 23 of the metallic carrier 20 and the sidewalls of the interposer 11' and extends into the through openings 219. The first insulating layer 312 extends laterally on the interposer 11' and the balancing layer 311 and contacts and provides robust mechanical bonds between the first metal sheet 31 and the interposer 11' and between the first metal sheet 31 and the balancing layer 311. The second insulating layer 322 extends laterally on the second surface 213 of the metal carrier 20 and contacts and provides robust mechanical bonds between the second metal sheet 32 and the metallic carrier 20.

Figure 62:
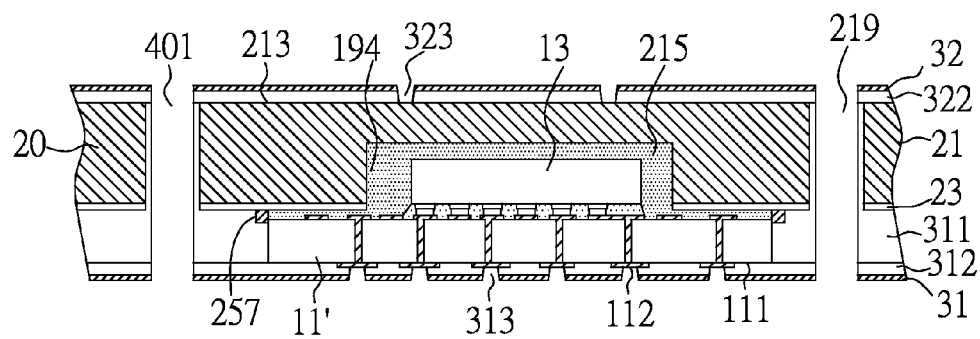
FIG. 62 is a cross-sectional view showing a state in which the structure of FIG. 61 is provided with via openings and through holes in accordance with the fourth embodiment of the present invention.

FIG. 62 is a cross-sectional view of the structure provided with first and second via openings 313, 323 and through holes 401. The first via openings 313 extend through the first metal sheet 31 and the first insulating layer 312 and are aligned with the first contact pads 112 of the interposer 11'. The second via openings 323 extend through the second metal sheet 32 and the second insulating layer 322 and are aligned with selected portions of the metallic carrier 20. The through holes 401 are aligned with the through openings 219 and extend though the first metal sheet 31, the first insulating layer 312, the balancing layer 311, the second insulating layer 322 and the second metal sheet 32 in vertical directions.

Figure 63:
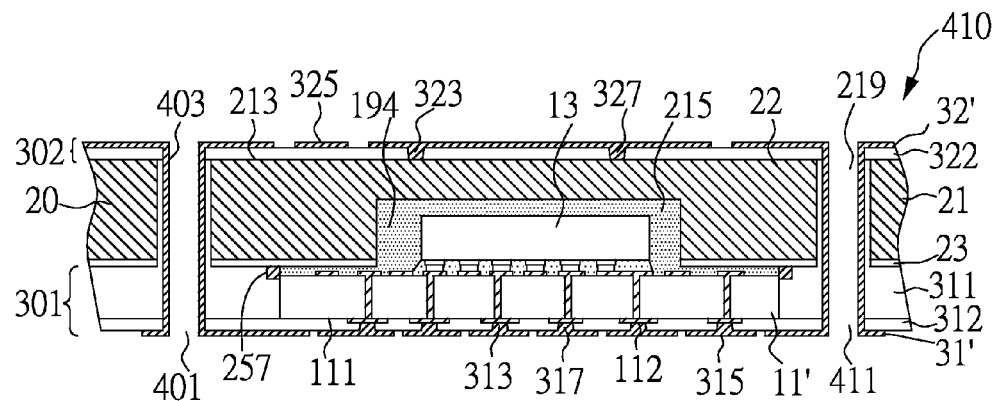
FIG. 63 is a cross-sectional view showing a state in which the structure of FIG. 62 is provided with conductive traces and plated through holes to finish the fabrication of a semiconductor package in accordance with the fourth embodiment of the present invention.

Referring now to FIG. 63, first conductive traces 315 and second conductive traces 325 are respectively formed on the first insulating layer 312 and the second insulating layer 322 by depositing a first plated layer 31' on the first metal sheet 31 and into the first via openings 313, depositing a second plated layer 32' on the second metal sheet 32 and into the second via openings 323, and then patterning the first and second metal sheets 31, 32 as well as the first and second plated layers 31', 32' thereon. Also, a connecting layer 403 is deposited in the through holes 401 to provide the plated through holes 411. The first conductive traces 315 extend from the first insulating layer 312 in the downward direction, extend laterally on the first insulating layer 312 and extend into the first via openings 313 in the upward direction to form the first conductive vias 317 in direct contact with the first contact pads 112 of the interposer 11', thereby providing signal routings for the interposer 11'. The second conductive traces 325 extend from the second insulating layer 322 in the upward direction, extend laterally on the second insulating layer 322 and extend into the second via openings 323 in the downward direction to form the second conductive vias 327 in direct contact with selected portions of the metallic carrier 20 for heat dissipation and ground connection. The plated through holes 411 at the first end extend to the first conductive traces 315 and at the second end extend to the second conductive traces 325 to provide a vertical signal connection pathway.

Accordingly, as shown in FIG. 63, a semiconductor package 410 is accomplished and includes an interposer 11', a chip 13, a metallic carrier 20, a first buildup circuitry 301, a second buildup circuitry 302 and plated through holes 411. The chip 13 is electrically coupled to the pre-fabricated interposer 11' by flip chip process to form a chip-on-interposer subassembly 10. The metallic carrier 20 which serves as a metallic heat spreader 22 includes a cavity 215 that extends through the dielectric layer and extends into the metal plate 21. The chip-on-interposer subassembly 10 is attached to the metallic carrier 20 using an adhesive 194 with the chip 13 positioned within the cavity 215 and the alignment guide 257 laterally aligned with and in close proximity to the peripheral edges of the interposer 11'. The adhesive 194 surrounds the embedded chip 13, and the squeezed out portion contacts and is sandwiched between the second surface 113 of the interposer 11' and the dielectric layer 23 and serves as the interposer attach adhesive. The alignment guide 257 of the metallic carrier 20 extends from the dielectric layer 23 and extends beyond the second surface 113 of the interposer 11' in the downward direction and is in close proximity to the peripheral edges of the interposer 11' to provide critical placement accuracy for the interposer 11'. The first buildup circuitry 301 is electrically coupled to the interposer 11' through the first conductive vias 317 and provides fan out routing/interconnection. The second buildup circuitry 302 is thermally and electrically coupled to the metallic carrier 20 through the second conductive vias 327 for heat dissipation and ground connection. The plated through holes 411 are electrically coupled to the first and second conductive traces 315, 325 and provides the semiconductor package with stacking capacity.

Figure 64:
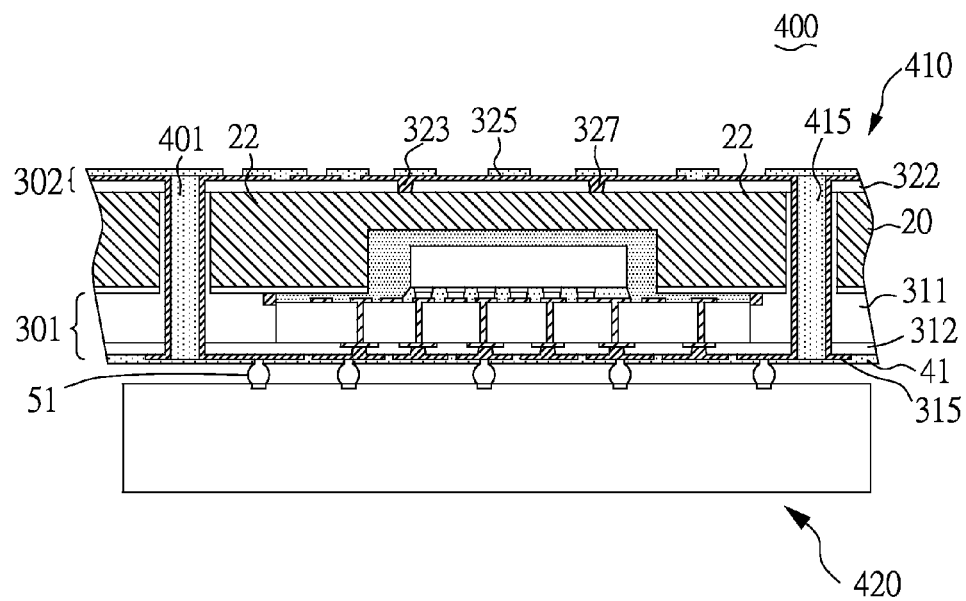
FIG. 64 is a cross-sectional view showing a package-on-package assembly with another semiconductor package mounted on the semiconductor package of FIG. 63 in accordance with the fourth embodiment of the present invention.

FIG. 64 is a cross-sectional view of a package-on-package assembly 400 with another semiconductor package 420 mounted on the first buildup circuitry 301 of the semiconductor package 410 illustrated in FIG. 63. In this illustration, the semiconductor package 410 is further provided with an insulative filler 415 in the remaining space of the through holes 401 and solder mask material 41 on the first and second buildup circuitries 301, 302. The solder mask material 41 includes solder mask openings to expose selected portions of the first and second conductive traces 315, 325. Accordingly, the semiconductor package 420 is mounted on the exposed portions of the first conductive traces 315 of the semiconductor package 410 via solder balls 51.

The packages and assemblies described above are merely exemplary. Numerous other embodiments are contemplated. In addition, the embodiments described above can be mixed-and-matched with one another and with other embodiments depending on design and reliability considerations. The chip can share or not share the cavity with other chips. For instance, a cavity can accommodate a single chip, and the metallic heat spreader can include multiple cavities arranged in an array for multiple chips. Alternatively, numerous chips can be positioned within a single cavity. Likewise, a chip can share or not share the interposer with other chips. For instance, a single chip can be electrically connected to the interposer. Alternatively, numerous chips may be coupled to the interposer. For instance, four small chips in a 2×2 array can be coupled to the interposer and the interposer can include additional contact pads to receive and route additional chip pads. Also, the buildup circuitry can include additional conductive traces to accommodate additional contact pads of the interposer.

As illustrated in the aforementioned embodiments, a distinctive semiconductor package for package-on-package stacking applications is configured to exhibit improved thermal performance and reliability, which includes a chip, an interposer, an adhesive, a metallic heat spreader, a first buildup circuitry, a second buildup circuitry and plated through holes.

The chip is electrically coupled to the interposer by a plurality of bumps to form a chip-on-interposer subassembly. The chip can be a packaged or unpackaged chip. Furthermore, the chip can be a bare chip, or a wafer level packaged die, etc.

The metallic heat spreader can extend to the peripheral edges of the semiconductor package to provide mechanical support for the chip, the interposer and the first and second buildup circuitries. Alternatively, the metallic heat spreader may be spaced from the peripheral edges of the semiconductor package. In a preferred embodiment, the metallic heat spreader includes a metal plate to provide essential thermal dissipation and electromagnetic shielding for the embedded chip. The metal plate can have a thickness of 0.1 mm to 10 mm. The material of the metal plate can include copper, aluminum, stainless steel or their alloys. Further, the metallic heat spreader includes a cavity extending into the metal plate, and encloses the chip in the cavity. As such, the metallic bottom and the metallic sidewalls of the cavity can provide thermal contact surfaces and vertical and horizontal electromagnetic shielding for the embedded chip.

The metallic heat spreader can be a single-layer structure or multi-layer structure, and may be fabricated from a metallic carrier with an alignment guide beyond the cavity. The metallic carrier with the alignment guide can be fabricated by the steps of: providing a metal plate; forming a cavity in the metal plate; and forming an alignment guide around the entrance of the cavity by removing a selected portion of the metal plate or by pattern deposition of a metal or a plastic material on the metal plate to form the alignment guide. Accordingly, the metallic heat spreader fabricated from the metallic carrier is a metal plate with a cavity defined therein and a flat surface laterally extending from the cavity entrance. As an alternative, the metallic carrier with the alignment guide is fabricated by the steps of: providing a laminate substrate that includes a dielectric layer and a metal plate; forming an alignment guide on the dielectric layer by removing a selected portion of a metal layer on the dielectric layer or by pattern deposition of a metal or a plastic material on the dielectric layer to form the alignment guide; and forming a cavity that extends through the dielectric layer and extends into the metal plate. As a result, the metallic heat spreader fabricated from the metallic carrier is a laminate substrate including a metal plate and a dielectric layer, and has a cavity that extends through the dielectric layer and extends into the metal plate. For the aspect of the metallic heat spreader extending to the peripheral edges of the semiconductor package, the entire metallic carrier is retained and serves as the metallic heat spreader. For another aspect of the metallic heat spreader spaced from the peripheral edges of the semiconductor package, the metallic carrier is selectively removed to form the metallic heat spreader, which is a selected remaining portion of the metallic carrier, and a core layer is further provided to fill the removed portion of the metallic carrier and cover the sidewalls of the metallic heat spreader. The core layer can have a first surface substantially coplanar with the first surface of the metallic heat spreader and an opposite second surface substantially coplanar with the second surface of the metallic heat spreader. Further, in addition to the above selected remaining portion for serving as the metallic heat spreader, another selected metal portion of the metallic carrier may be retained to serve as a metallic post for power/ground or signal connection, and the core layer also laterally covers the sidewalls of the metallic posts. The metallic posts are spaced from the metallic heat spreader by the core layer and can be substantially coplanar with the core layer and the metallic flat surfaces of the metallic heat spreader in the first and second vertical directions (for the convenience of description, the direction in which the first surface of the interposer faces is defined as the first vertical direction, and the direction in which the second surface of the interposer faces is defined as the second vertical direction). The core layer material can include epoxy, BT, polyimide and other kinds of resin or resin/glass composite, and provides mechanical support for the metallic heat spreader and the optional metallic post in lateral directions.

The alignment guide can extend from a flat surface of the metallic heat spreader adjacent to the cavity entrance and extend beyond the second surface of the interposer in the first vertical direction. As such, the interposer placement accuracy can be provided by the alignment guide that is laterally aligned with and in close proximity to the peripheral edges of the interposer. The alignment guide can be made of a metal, a photosensitive plastic material or non-photosensitive material. For instance, the alignment guide can consist essentially of copper, aluminum, nickel, iron, tin or their alloys. The alignment guide can also include or consist of epoxy or polyimide. Further, the alignment guide can have patterns against undesirable movement of the interposer. For instance, the alignment guide can include a continuous or discontinuous strip or an array of posts. Alternatively, the alignment guide may laterally extend to the peripheral edges of the metallic heat spreader and have inner peripheral edges that conform to the peripheral edges of the interposer. Specifically, the alignment guide can be laterally aligned with four lateral surfaces of the interposer to define an area with the same or similar topography as the interposer and prevent the lateral displacement of the interposer. For instance, the alignment guide can be aligned along and conform to four sides, two diagonal corners or four corners of the interposer, and the gaps in between the interposer and the alignment guide preferably is in a range of about 5 to 50 microns. As a result, the alignment guide located beyond the interposer can provide placement accuracy for the chip-on-interposer subassembly. Besides, the alignment guide around the cavity entrance preferably has a height in a range of 5-200 microns.

The cavity of the metallic heat spreader can have a larger diameter or dimension at its entrance than at its bottom and a depth of 0.05 mm to 1.0 mm. For instance, the cavity can have a cut-off conical or pyramidal shape in which its diameter or dimension increases as it extends in the first vertical direction from its bottom to its entrance. Alternatively, the cavity can have a cylindrical shape with a constant diameter. The cavity can also have a circular, square or rectangular periphery at its entrance and its bottom.

The adhesive can be dispensed on the cavity bottom and then be squeezed partially out of the cavity when inserting the chip into the cavity. Accordingly, the adhesive can contact and surround the embedded chip within the cavity of the metallic heat spreader, and the squeezed out portion can contact and be sandwiched between the second surface of the interposer and the flat surface of the metallic heat spreader that laterally extends from the cavity entrance. Alternatively, a thermally conductive adhesive can be dispensed on the cavity bottom and be contained within the cavity when inserting the chip into the cavity. A second adhesive (typically an electrically insulating underfill) can then be dispensed and filled into the remaining space within the cavity and extends to the space between the second surface of the interposer and the flat surface of the metallic heat spreader that laterally extends from the cavity entrance. Accordingly, the first adhesive provides mechanical bonds and thermal connection between the chip and the metallic heat spreader while the second adhesive provides mechanical bonds between the interposer and the metallic heat spreader.

The interposer laterally extends beyond the cavity and can be attached to the flat surface of the metallic heat spreader adjacent to the cavity entrance with its second surface facing the metallic heat spreader. The interposer can be a silicon, glass, ceramic or graphite material with a thickness of 50 to 500 microns, and can contain a pattern of traces that fan out from a fine pitch at the second contact pads to a coarse pitch at the first contact pads. Accordingly, the interposer can provide first level fan-out routing/interconnection for the embedded chip. Additionally, as the interposer is typically made of a high elastic modulus material with CTE closely matches to that of the chip (for example, 3 to 10 ppm per degree Centigrade), internal stresses in chip and its electrical interconnection caused by CTE mismatch can be largely compensated or reduced.

The first and second buildup circuitries are respectively disposed adjacent to the first surface of the interposer and the second surface of the metallic heat spreader and can provide secondary fan-out routing/interconnection. Besides, the first and second buildup circuitries can further be electrically coupled to the metallic surface of the metallic heat spreader or/and the optional metallic post by additional conductive vias for ground connection. The first buildup circuitry includes a balancing layer, a first insulating layer and one or more first conductive traces. The second buildup circuitry includes a second insulating layer and one or more second conductive traces. The balancing layer laterally covers sidewalls of the interposer and the first insulating layer is deposited on the first surface of the interposer and the balancing layer. The second insulating layer covers the second surface of the metallic heat spreader and the core layer. For the aspect of the metallic carrier being selectively removed, the balancing layer is provided before selectively removing portions of the metallic carrier, and the second insulating layer is provided after selectively removing portions of the metallic carrier and forming the core layer. The first conductive traces extend laterally on the first insulating layer and extend through first via openings in the first insulating layer to form first conductive vias in direct contact with the first contact pads of the interposer and optionally with the metallic heat spreader or the optional metallic post. The second conductive traces extend laterally on the second insulating layer and extend through one or more optional second via openings in the second insulating layers to form one or more second conductive vias in direct contact with the metallic heat spreader and/or the optional metallic post. Accordingly, the first conductive traces can directly contact the first contact pads to provide signal routing for the interposer, and thus the electrical connection between the interposer and the first buildup circuitry can be devoid of soldering material. Besides, as the conductive vias in direct contact with the metallic heat spreader can serve as heat pipes, the heat generated from the chip can be dissipated to outer conductive layers of the first and second buildup circuitries by the conductive vias.

The first and second buildup circuitries can further include additional insulating layers, additional via openings, and additional conductive traces if needed for further signal routing. The outmost conductive traces of the first and second buildup circuitries can respectively accommodate conductive joints, such as solder balls, for electrical communication and mechanical attachment with another semiconductor package. Accordingly, a package-on-package assembly can be provided by mounting another semiconductor package on the first or second buildup circuitry using conductive joints on the outmost conductive traces.

The plated though holes at the first end can extend to and be electrically connected to an outer or inner conductive layer of the first buildup circuitry, and at the second end can extend to and be electrically connected to an outer or inner conductive layer of the second buildup circuitry so as to provide signal routing in the vertical direction between the first buildup circuitry and the second buildup circuitry. In any case, the plated through hole can provide electrical and thermal connections between the first buildup circuitry and the second buildup circuitry.

The plated through holes can be formed by the steps of: forming through holes that vertically extend to the first buildup circuitry at the first end and to the second buildup circuitry at the second end; and then depositing a connecting layer on inner sidewalls of the through holes. For the aspect of the metallic heat spreader spaced from the peripheral edges of the semiconductor package, the plated through holes extend through the core layer that covers the sidewalls of the metallic heat spreader. Accordingly, the plated through holes are formed by the steps of: forming through holes that extend through the core layer; and then depositing a connecting layer on inner sidewalls of the through holes. In this case, the through holes can be provided after depositing the balancing layer, the core layer and the first and second insulating layers and can extend through the balancing layer, the core layer and one or more insulating layers of the buildup circuitries in the vertical directions. As for the alternative aspect of the metallic heat spreader extending to the peripheral edges of the semiconductor package, the metallic heat spreader includes through openings with the balancing layer extending thereinto, and the plated through holes are aligned with through openings of the heat sink and extend through the balancing layer. Accordingly, the plated through holes can be formed by the steps of: forming through holes that extend through the balancing layer and are aligned with the through openings; and then depositing a connecting layer on inner sidewalls of the through holes. As such, the through holes can be provided after depositing the balancing layer and the first and second insulating layers and can extend through the balancing layer and one or more insulating layers of the buildup circuitries in the vertical directions. Further, the connecting layer of the plated through hole can be simultaneously deposited while forming the outer or inner conductive traces of the buildup circuitry.

The term "cover" refers to incomplete or complete coverage in a vertical and/or lateral direction. For instance, in the cavity-down position, the metal plate covers the chip in the upward direction regardless of whether another element such as the adhesive is between the metal plate and the chip.

The phrase "aligned with" refers to relative position between elements regardless of whether elements are spaced from or adjacent to one another or one element is inserted into and extends into the other element. For instance, the alignment guide is laterally aligned with the interposer since an imaginary horizontal line intersects the alignment guide and the interposer, regardless of whether another element is between the alignment guide and the interposer and is intersected by the line, and regardless of whether another imaginary horizontal line intersects the interposer but not the alignment guide or intersects the alignment guide but not the interposer. Likewise, the first via opening is aligned with the first contact pads of the interposer.

The phrase "in close proximity to" refers to a gap between elements not being wider than a maximum acceptable limit. As known in the art, when the gap between the alignment guide and the interposer is not narrow enough, the location error of the interposer due to the lateral displacement of the interposer within the gap may exceed the maximum acceptable error limit. In some cases, once the location error of the interposer goes beyond the maximum limit, it is impossible to align the predetermined portion of the interposer with a laser beam, resulting in the electrical connection failure between the interposer and the buildup circuitry. According to the pad size of the interposer, those skilled in the art can ascertain the maximum acceptable limit for a gap between the interposer and the alignment guide through trial and error to ensure the conductive vias being aligned with the contact pads of the interposer. Thereby, the description "the alignment guide is in close proximity to the peripheral edges of the interposer" means that the gap between the alignment guide and the peripheral edges of the interposer is narrow enough to prevent the location error of the interposer from exceeding the maximum acceptable error limit.

The phrases "electrical connection", "electrically connected", "electrically coupled" and "electrically couples" refer to direct and indirect electrical connection. For instance, the first conductive traces directly contact and are electrically connected to the first contact pads of the interposer, and the third conductive traces are spaced from and electrically connected to the first contact pads of the interposer by the first conductive traces.

The "first vertical direction" and "second vertical direction" do not depend on the orientation of the package, as will be readily apparent to those skilled in the art. For instance, the first surface of the interposer faces the first vertical direction and the second surface of the interposer faces the second vertical direction regardless of whether the package is inverted. Likewise, the alignment guide is "laterally" aligned with the interposer in a lateral plane regardless of whether the package is inverted, rotated or slanted. Thus, the first and second vertical directions are opposite one another and orthogonal to the lateral directions, and a lateral plane orthogonal to the first and second vertical directions intersects laterally aligned elements. Furthermore, the first vertical direction is the upward direction and the second vertical direction is the downward direction in the cavity-up position, and the first vertical direction is the downward direction and the second vertical direction is the upward direction in the cavity-down position.

The semiconductor package for package-on-package stacking applications according to the present invention has numerous advantages. For instance, the chip is electrically coupled to the interposer by a well-known flip chip bonding process such as thermo-compression or solder reflow, which can avoid the positional accuracy issue inherent in most stackable approaches where an adhesive carrier is used for temporary bonding. The interposer provides a first level fan-out routing/interconnection for the embedded chip whereas the buildup circuitry provides a second level fan-out routing/interconnection. As the buildup circuitry is formed on the interposer designed with larger pad size and pitch space, the manufacturing yield is greatly improved compared to the conventional types where buildup circuitry is directly formed on the chip I/O pad without fan-out routing. The alignment guide can provide critical placement accuracy for the interposer. As such, the shape or depth of the cavity that houses the embedded chip is not a critical parameter that needs to be tightly controlled. The metallic heat spreader can provide thermal dissipation, electromagnetic shielding and moisture barrier for the embedded chip, and also provides mechanical support for the chip, the interposer and the buildup circuitry. The direct electrical connection without solder between the interposer and the buildup circuitry is advantageous to high I/O and high performance. The dual buildup circuitries can provide signal routing with simple circuitry patterns or flexible multi-layer signal routing with complex circuitry patterns. The plated through hole can provide vertical signal routing between the dual buildup circuitries, thereby providing the package with stacking capability. The package made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A method of making a semiconductor package with package-on-package stacking capability, comprising the steps of:
   providing a chip;
   providing an interposer that includes a first surface, a second surface opposite to the first surface, first contact pads on the first surface, second contact pads on the second surface, and through vias that electrically couple the first contact pads and the second contact pads;
   electrically coupling the chip to the second contact pads of the interposer by a plurality of bumps to form a chip-on-interposer subassembly;
   providing a metallic carrier having a first surface, an opposite second surface, and a cavity formed in the first surface;
   attaching the chip-on-interposer subassembly to the metallic carrier using an adhesive with the chip inserted into the cavity and the interposer laterally extending beyond the cavity;
   with the chip-on-interposer subassembly attached to the metallic carrier, forming a first buildup circuitry on the first surface of the interposer, wherein the first buildup circuitry is electrically coupled to the first contact pads of the interposer through first conductive vias of the first buildup circuitry;
   selectively removing portions of the metallic carrier to form a metallic heat spreader, which is a first remaining portion of the metallic carrier enclosing the chip within the cavity and has a first surface corresponding to the first surface of the metallic carrier and an opposite second surface;
   forming a core layer that laterally covers sidewalls of the metallic heat spreader;
   forming a second buildup circuitry on the second surface of the metallic heat spreader and the core layer; and
   forming plated through holes that extend through the core layer to provide electrical and thermal connections between the first buildup circuitry and the second buildup circuitry.

2. The method of claim 1, wherein the step of electrically coupling the chip to the second contact pads of the interposer is performed on a panel scale, and a singulation step is executed to separate individual chip-on-interposer subassemblies before the step of attaching the chip-on-interposer subassembly to the metallic carrier.

3. The method of claim 1, wherein the metallic carrier further includes an alignment guide beyond the cavity, and the chip-on-interposer subassembly is attached to the metallic carrier with the alignment guide laterally aligned with and in close proximity to peripheral edges of the interposer.

4. The method of claim 1, wherein the second buildup circuitry comprises second conductive vias for electrically and thermally coupling to the metallic heat spreader.

5. The method of claim 1, wherein the step of selectively removing portions of the metallic carrier is performed to also form a metallic post, which is a second remaining portion of the metallic carrier spaced from the first remaining portion.

6. A semiconductor package with package-on-package stacking capability, comprising:
   a chip;
   an interposer having a first surface, a second surface opposite to the first surface, first contact pads on the first surface, second contact pads on the second surface, and through vias that electrically couple the first contact pads and the second contact pads;
   a metallic heat spreader having a first surface, an opposite second surface, and a cavity formed in the first surface;
   a first buildup circuitry formed on the first surface of the interposer, wherein the first buildup circuitry is electrically coupled to the first contact pads of the interposer through first conductive vias of the first buildup circuitry;
   a core layer laterally covering sidewalls of the metallic heat spreader;
   a second buildup circuitry formed on the second surface of the metallic heat spreader and the core layer; and
   plated through holes that extend through the core layer for providing electrical and thermal connections between the first buildup circuitry and the second buildup circuitry,
   wherein the chip is electrically coupled to the second contact pads of the interposer by a plurality of bumps to form a chip-on-interposer subassembly; and
   the chip-on-interposer subassembly is attached to the metallic heat spreader using an adhesive with the chip enclosed in the cavity and the interposer laterally extending beyond the cavity.

7. The semiconductor package with package-on-package stacking capability according to claim 6, wherein the metallic heat spreader further includes an alignment guide beyond the cavity, and the chip-on-interposer subassembly is attached to the metallic heat spreader with the alignment guide laterally aligned with and in close proximity to peripheral edges of the interposer.

8. The semiconductor package with package-on-package stacking capability according to claim 6, wherein the second buildup circuitry is electrically and thermally coupled to the metallic heat spreader through second conductive vias of the second buildup circuitry.

9. The semiconductor package with package-on-package stacking capability according to claim 6, further comprising a metallic post spaced from the metallic heat spreader.

\* \* \* \* \*